US010204907B2

(12) United States Patent
Leobandung et al.

(10) Patent No.: US 10,204,907 B2
(45) Date of Patent: Feb. 12, 2019

(54) METAL-INSULATOR-METAL CAPACITOR ANALOG MEMORY UNIT CELL

(71) Applicant: International Business Machines Corporation, Armonk, NY (US)

(72) Inventors: Effendi Leobandung, Stormville, NY (US); Yulong Li, Westchester, NY (US); Paul Solomon, Westchester, NY (US); Chun-Chen Yeh, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/056,032

(22) Filed: Aug. 6, 2018

(65) Prior Publication Data

US 2019/0006366 A1    Jan. 3, 2019

Related U.S. Application Data

(62) Division of application No. 15/635,709, filed on Jun. 28, 2017, now Pat. No. 10,079,234.

(51) Int. Cl.
*H01L 21/00* (2006.01)
*H01L 27/108* (2006.01)

(52) U.S. Cl.
CPC ...... *H01L 27/108* (2013.01); *H01L 27/10844* (2013.01)

(58) Field of Classification Search
CPC ........................ H01L 27/108; H01L 27/10844
See application file for complete search history.

(56) References Cited

U.S. PATENT DOCUMENTS

| 7,425,740 | B2 | 9/2008 | Liu et al. |
|---|---|---|---|
| 8,565,003 | B2 | 10/2013 | Siau |
| 8,937,292 | B2 | 1/2015 | Bateman |
| 2004/0132250 | A1 | 7/2004 | Hazani |
| 2007/0080387 | A1 | 4/2007 | Liu et al. |
| 2008/0237714 | A1 | 10/2008 | Fazan |
| 2014/0355381 | A1 | 12/2014 | Lal et al. |
| 2016/0343452 | A1 | 11/2016 | Ikeda et al. |

OTHER PUBLICATIONS

Zurada, J. M., "Analog Implementation of Neural Networks", IEEE Circuits and Devices Magazine, Sep. 1992, vol. 8, Issue 5, pp. 36-41.
List of IBM Patents or Patent Applications Treated as Related, dated Aug. 6, 2018, 2 pages.

*Primary Examiner* — Richard A Booth
(74) *Attorney, Agent, or Firm* — Scully, Scott, Murphy & Presser, P.C.; L. Jeffrey Kelly, Esq.

(57) ABSTRACT

A memory device including a plurality of memory unit cells arranged in a crossbar configuration for a neural network is provided. Each of the memory unit cells includes a readout transistor, a charging transistor, a discharging transistor, and a metal-insulator-metal (MIM) capacitor connected to one of source/drain regions of each of the charging transistor and the discharging transistor and a functional gate of the readout transistor for storing analog information.

20 Claims, 27 Drawing Sheets

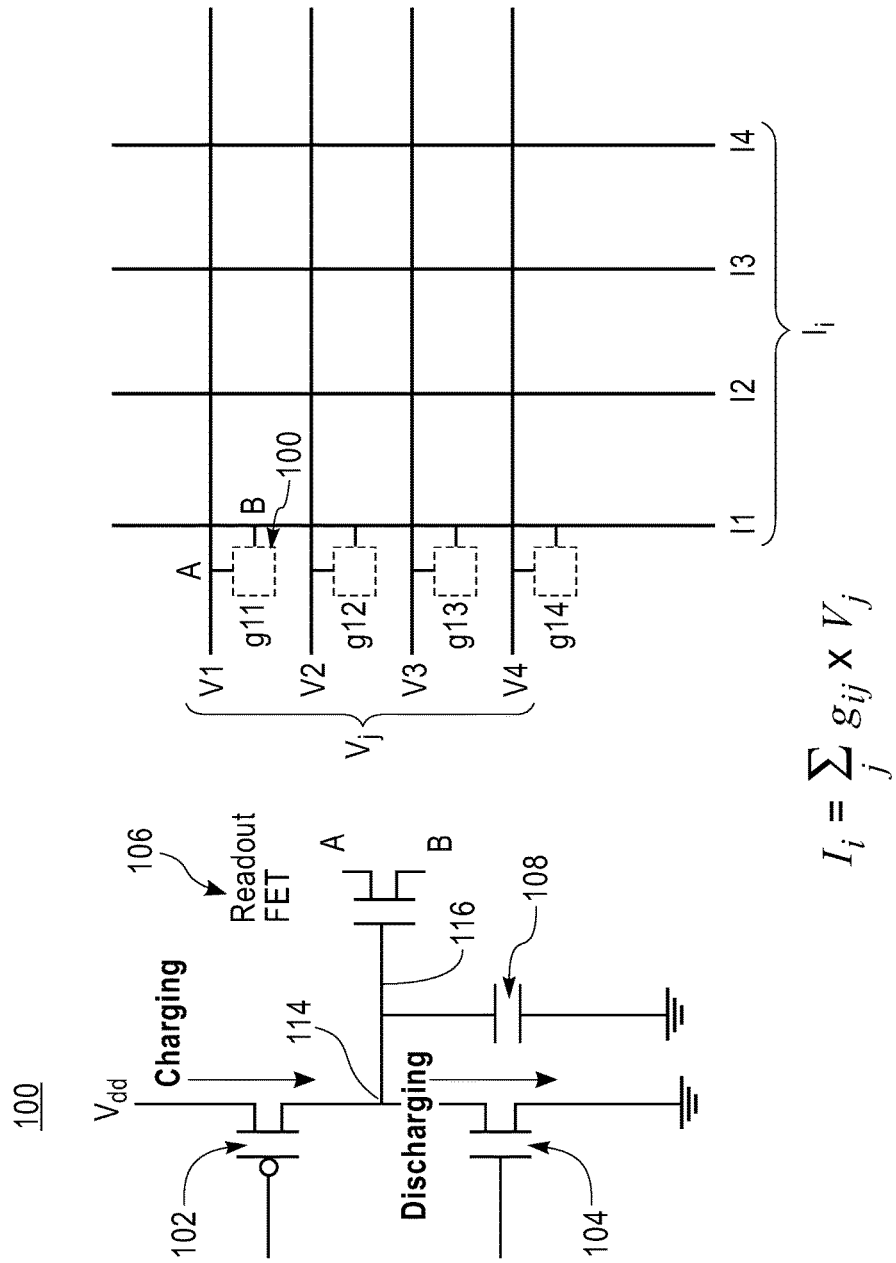

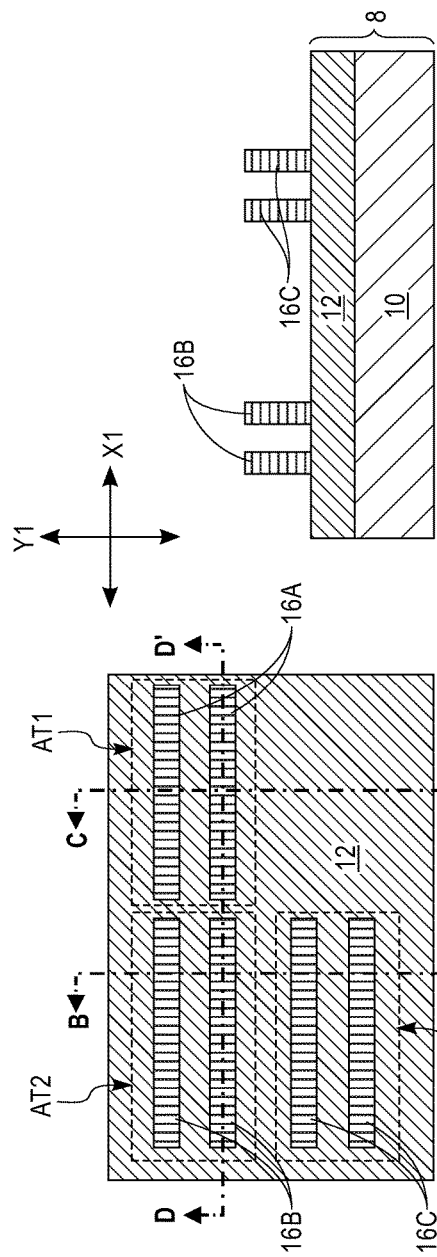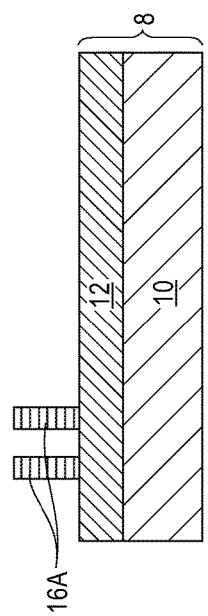
FIG. 2A
FIG. 2B
FIG. 2C

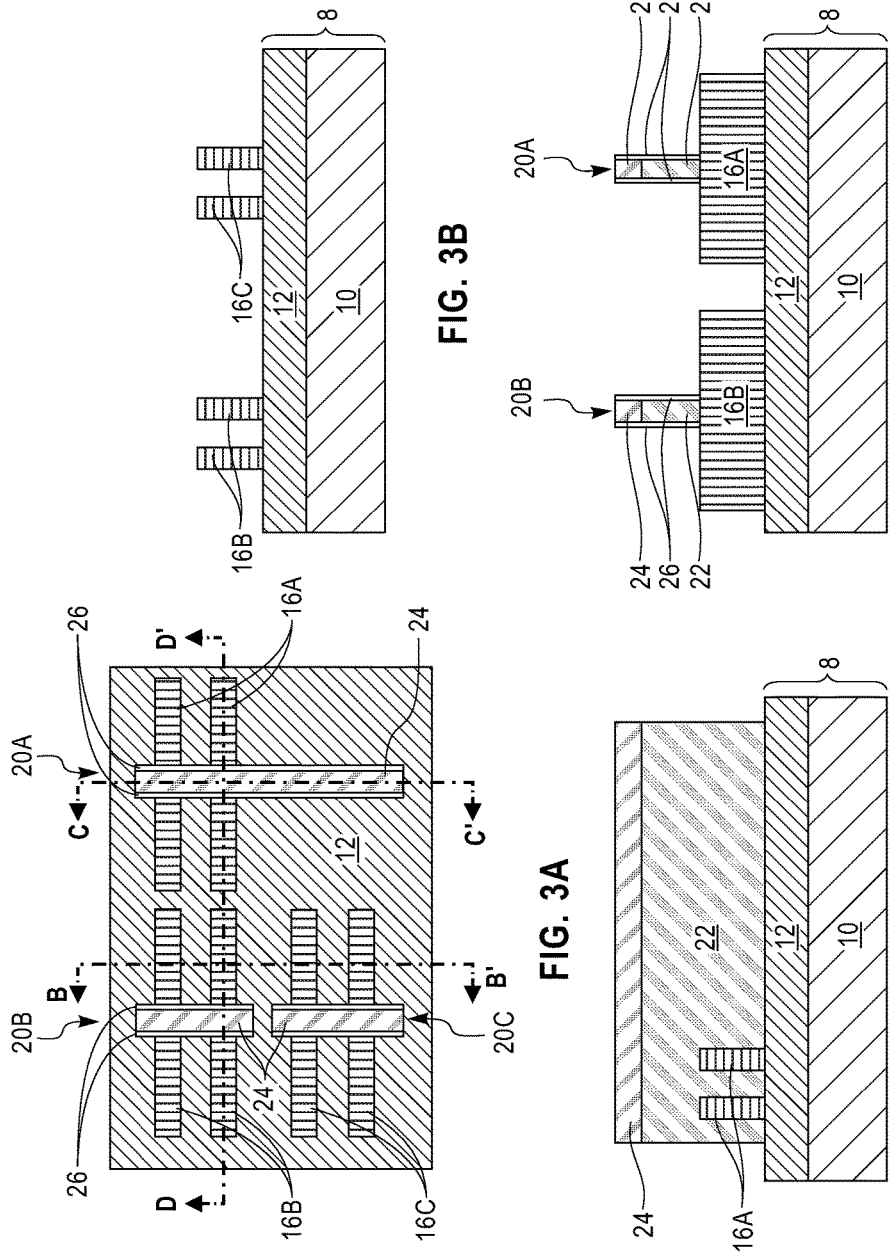

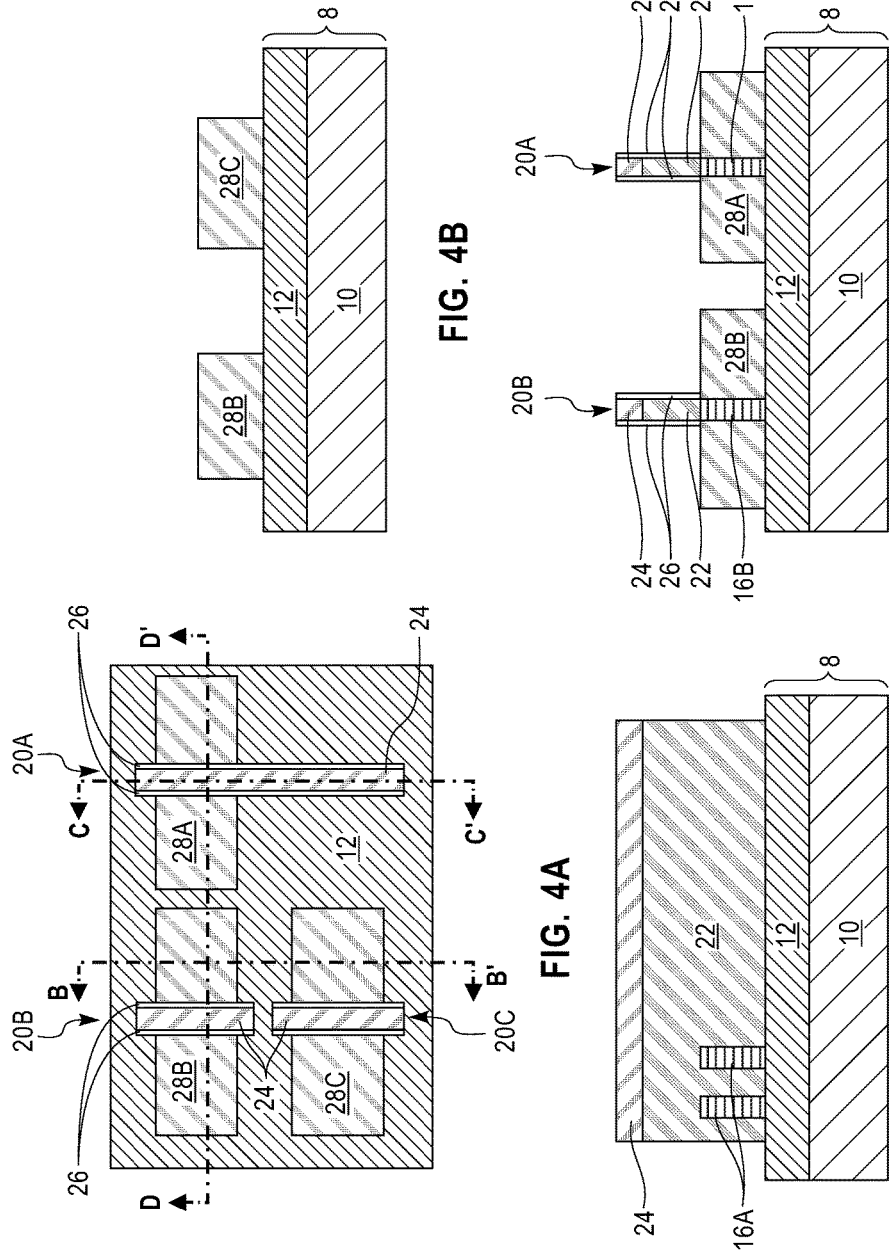

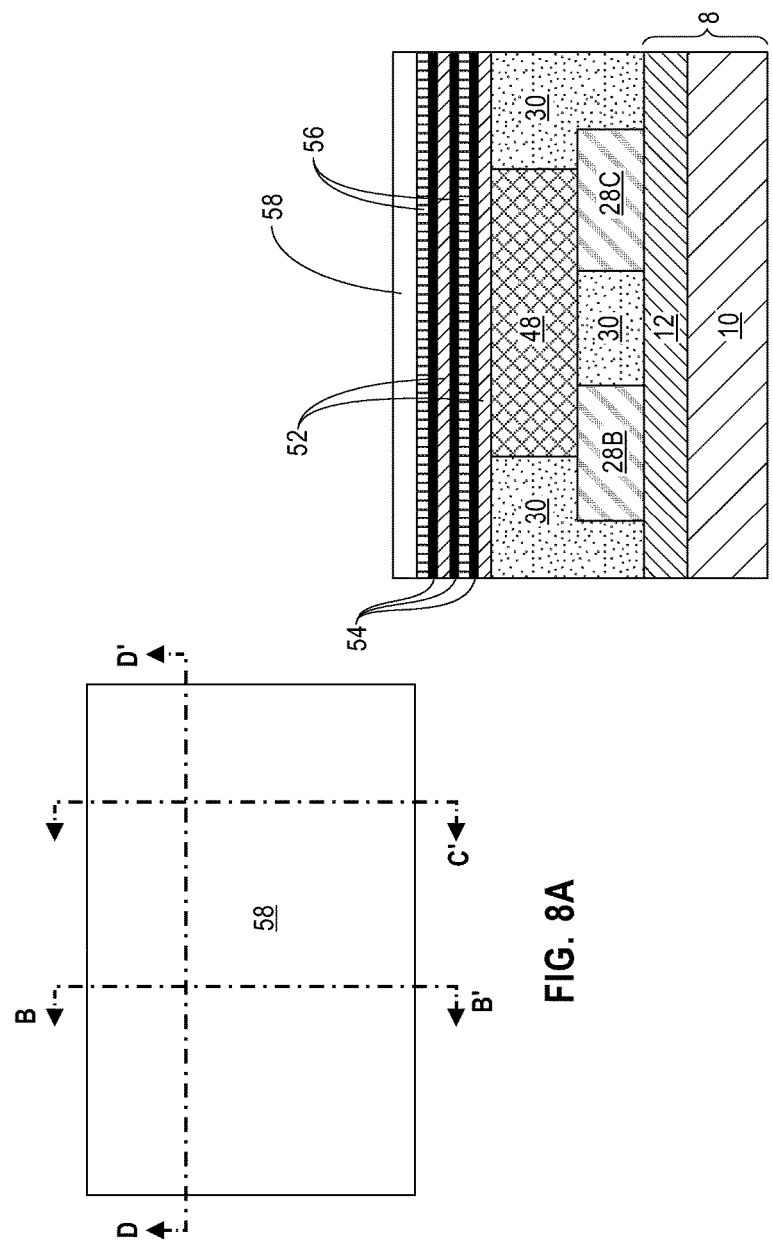

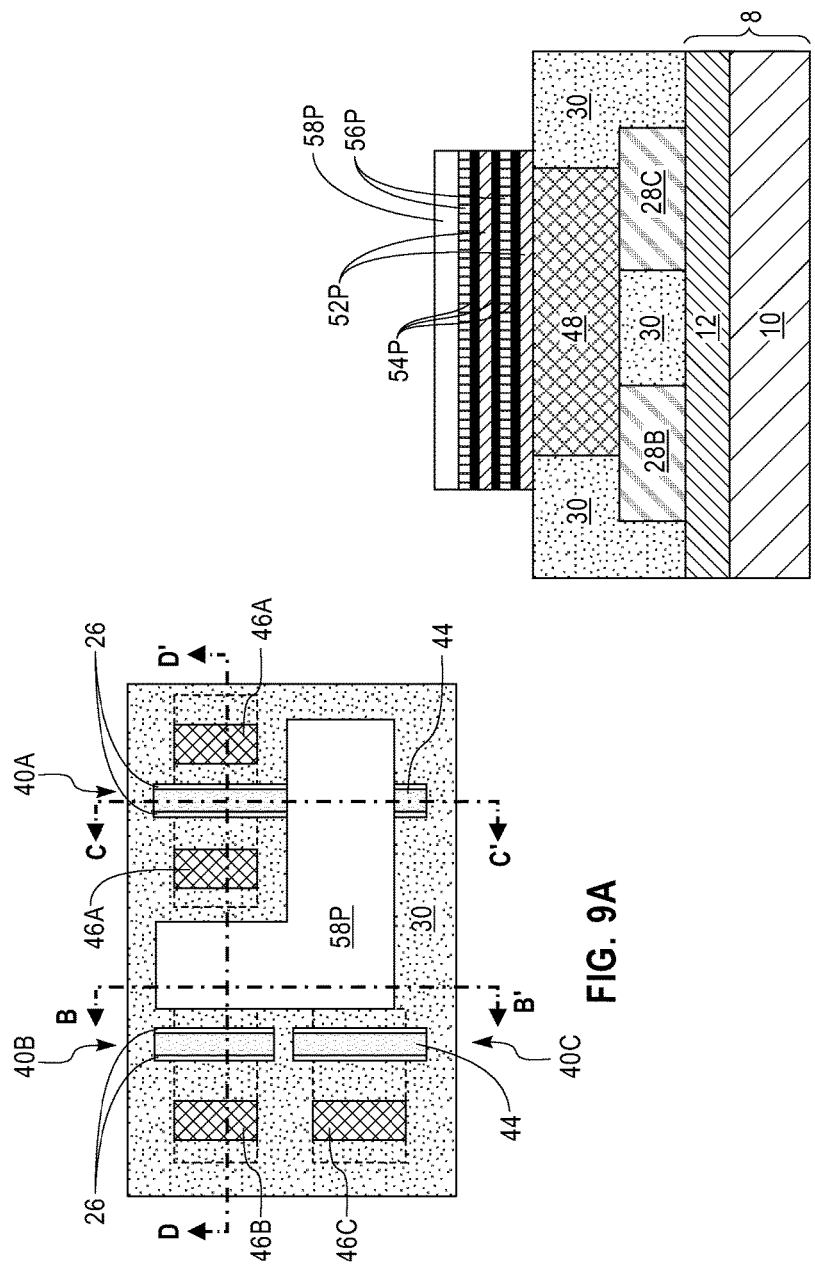

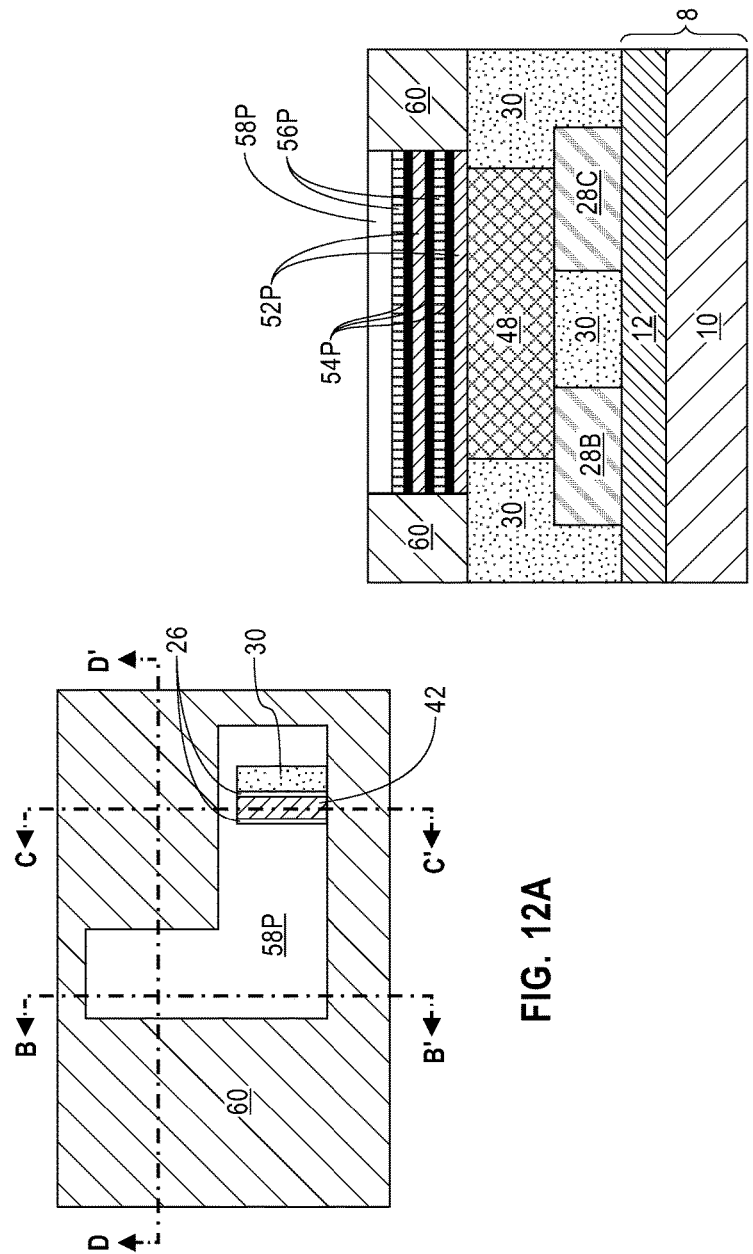

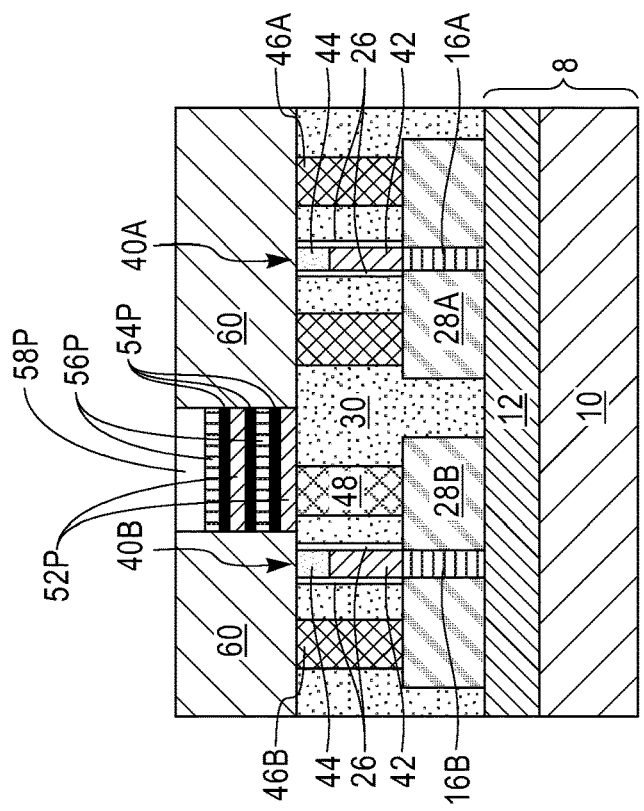
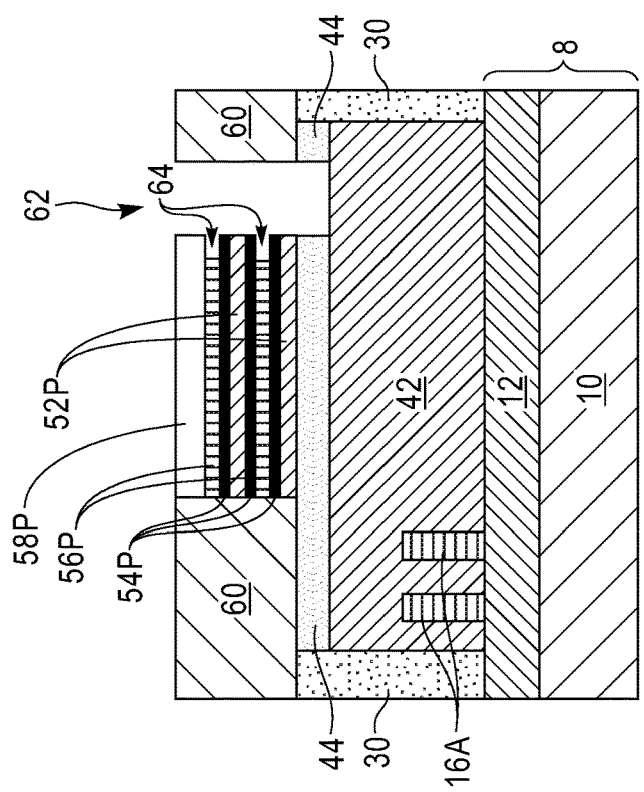
FIG. 12D
FIG. 12C

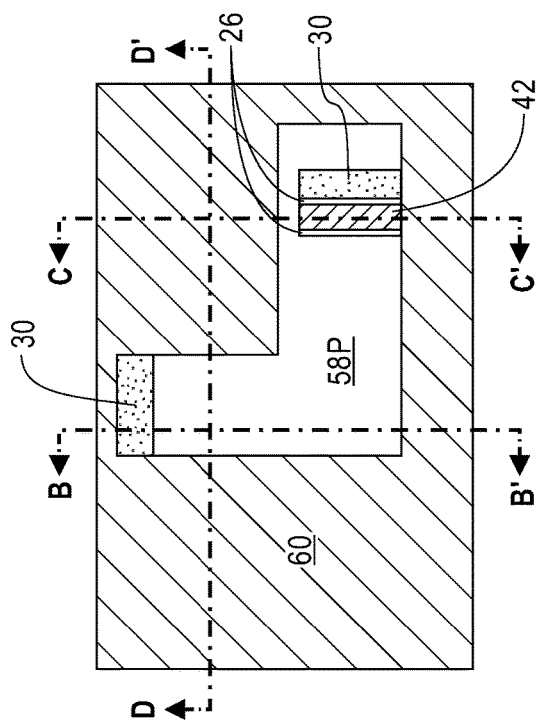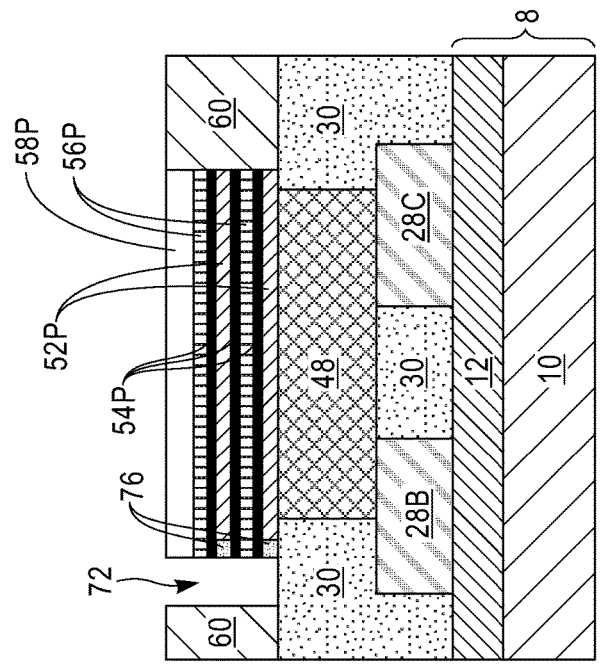
FIG. 15A
FIG. 15B

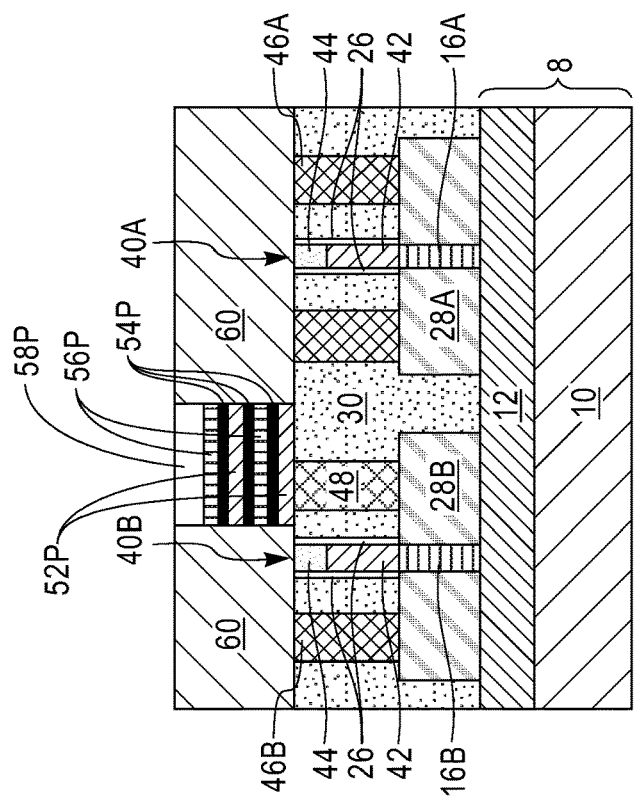
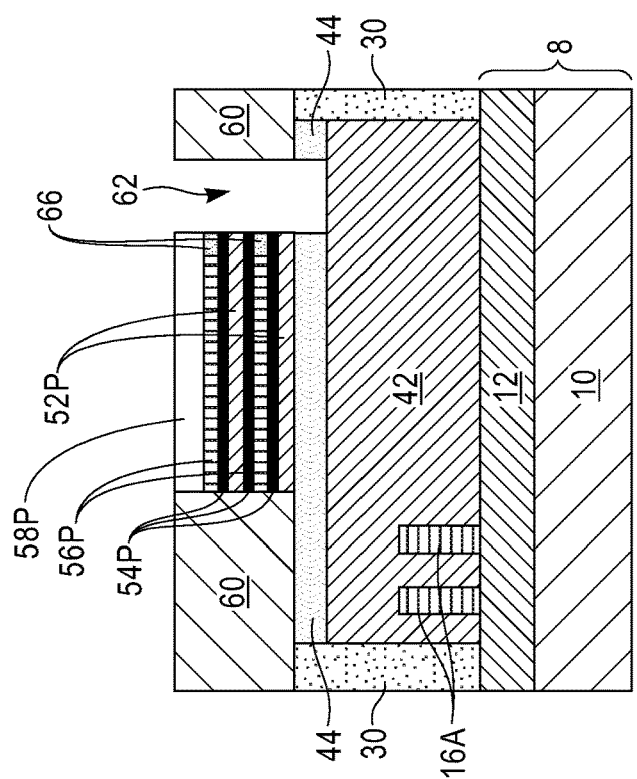

METAL-INSULATOR-METAL CAPACITOR ANALOG MEMORY UNIT CELL

BACKGROUND

The present application relates to neural network architecture, and particularly, to a memory unit cell including a metal-insulator-metal (MIM) capacitor for neural networks.

Neural networks have wide applicability in various technical fields including automatic recognition systems, such as character recognition systems, voice recognition systems, etc., activation control systems for robots and neuro computer systems incorporating artificial intelligence.

Current-based nonvolatile memory (NVM) devices represent states with different resistance values, and are attractive for neural network acceleration. Current-based memory devices in a crossbar configuration can implement vector-matrix multiplication in neural network computations. By mapping input vector to input voltages and weight matrix to resistive crossbar array, vector matrix multiplication can be calculated in a single step by sampling the current flowing in each column. This approach can be several orders of magnitude more efficient than CMOS ASIC approaches in terms of both speed and power.

Capacitors have been used as a storage element to store analog information in neutral network. Although charge stored on the capacitors can leak, several schemes have been developed to overcome that problem. For example, a periodic refresh scheme can be employed. Another approach is to guarantee that each neural network learning cycle is shorter than a certain time period, where the capacitor leakage is not significant enough to impact overall neural network training and convergence. Therefore, developing a compact memory unit cell structure with a capacitor as the analog information storage element remains needed for neural network applications.

SUMMARY

The present application provides a memory device including a plurality of memory unit cells arranged in a crossbar configuration for a neural network. Each of the unit memory cells includes a readout transistor, a charging transistor, a discharging transistor, and a metal-insulator-metal (MIM) capacitor connected to one of the source/drain regions of each of the charging transistor and the discharging transistor and a functional gate of the readout transistor for storing analog information.

According to an aspect of the present application, a memory cell array including a plurality of memory unit cells arranged in a crossbar configuration is provided. Each of the plurality of memory unit cells includes a first field effect transistor (FET) located in a first active region of a substrate and having a first functional gate stack that contacts a portion of a first semiconductor material portion and first source/drain regions located on opposite sides of the first functional gate stack, a second FET located in a second active region of the substrate and having a second functional gate stack that contacts a portion of a second semiconductor material portion and second source/drain regions located on opposite sides of the second functional gate stack, a third FET located in a third active region of the substrate and having a third functional gate stack that contacts a portion of a third semiconductor material portion and first source/drain regions located on opposite sides of the third functional gate stack, a source/drain interconnect structure overlying and connecting one of the second source/drain regions and one of the third source/drain regions, and a metal-insulator-metal (MIM) capacitor overlying and contacting the source/drain interconnect structure and a functional gate of the first functional gate stack.

According to another aspect of the present application, a method of forming a memory unit cell is provided. The method includes first providing a first FET that includes a first functional gate stack contacting a portion of a first semiconductor material portion and first source/drain regions located on opposite sides of the first functional gate stack in a first active region of a substrate, a second FET that includes a second functional gate stack contacting a portion of a second semiconductor material portion and second source/drain regions located on opposite sides of the second functional gate stack in a second active region of the substrate, and a third FET that includes a third functional gate stack contacting a portion of a third semiconductor material portion and third source/drain regions located on opposite sides of the third functional gate stack in a third active region of the substrate. Next, first source/drain contact structures overlying and contacting the first source/drain regions, a second source/drain contact structure overlying and contacting one of the second source/drain regions, a third source/drain contact structure overlying and contacting one of the third source/drain regions, and a source/drain interconnect structure connecting the other of the second source/drain regions and the other of the third source/drain regions are formed. The first, the second and the third source/drain contact structures and the source/drain interconnect structure are laterally surrounded by an interlevel dielectric (ILD) layer located over the substrate. Next, a metal-insulator-metal capacitor is formed overlying and contacting the source/drain interconnect structure and a functional gate of the first functional gate stack.

BRIEF DESCRIPTION OF SEVERAL VIEWS OF THE DRAWINGS

FIG. 1 is a circuit diagram of a memory device including a plurality of memory unit cells arranged in a crossbar configuration for achieving matrix-vector multiplication approximation operation.

FIG. 2A is a top-down view of an exemplary semiconductor structure including a set of first semiconductor material portions formed in a first active region of a substrate, a set of second semiconductor material portions formed in a second active region of the substrate, and a set of third semiconductor material portions formed in a third active region of the substrate according to an embodiment of the present application.

FIG. 2B is a cross-sectional view of the exemplary semiconductor structure of FIG. 2A along line B-B'.

FIG. 2C is a cross-sectional view of the exemplary semiconductor structure of FIG. 2A along line C-C'.

FIG. 3A is a top-down view of the exemplary semiconductor structure of FIGS. 2A-2C after forming a first sacrificial gate stack, a second sacrificial gate stack and a third sacrificial gate stack and forming a gate spacer on sidewalls of each sacrificial gate stack.

FIG. 3B is a cross-sectional view of the exemplary semiconductor structure of FIG. 3A along line B-B'.

FIG. 3C is a cross-sectional view of the exemplary semiconductor structure of FIG. 3A along line C-C'.

FIG. 3D is a cross-sectional view of the exemplary semiconductor structure of FIG. 3A along line D-D'.

FIG. 4A is a top-down view of the exemplary semiconductor structure of FIGS. 3A-3D after forming first source/drain regions, second source/drain regions and third source/drain regions.

FIG. 4B is a cross-sectional view of the exemplary semiconductor structure of FIG. 4A along line B-B'.

FIG. 4C is a cross-sectional view of the exemplary semiconductor structure of FIG. 4A along line C-C'.

FIG. 4D is a cross-sectional view of the exemplary semiconductor structure of FIG. 4A along line D-D'.

FIG. 8A is a top-down view of the exemplary semiconductor structure of FIGS. 7A-7D after forming a MIM stack and an insulator layer on the MIM stack.

FIG. 8B is a cross-sectional view of the exemplary semiconductor structure of FIG. 8A along line B-B'.

FIG. 9A is a top-down view of the exemplary semiconductor structure of FIGS. 8A-8D after patterning the insulator layer and the MIM stack to form a MIM capacitor and an insulator portion on the MIM capacitor.

FIG. 9B is a cross-sectional view of the exemplary semiconductor structure of FIG. 9A along line B-B'.

FIG. 12A is a top-down view of the exemplary semiconductor structure of FIGS. 11A-11D after laterally etching physically exposed second metal electrodes of the MIM capacitor to form first undercut regions.

FIG. 12B is a cross-sectional view of the exemplary semiconductor structure of FIG. 12A along line B-B'.

FIG. 12C is a cross-sectional view of the exemplary semiconductor structure of FIG. 12A along line C-C'.

FIG. 12D is a cross-sectional view of the exemplary semiconductor structure of FIG. 12A along line D-D'.

FIG. 15A is a top-down view of the exemplary semiconductor structure of FIGS. 14A-14D after laterally etching physically exposed first metal electrodes of the MIM capacitor to form second undercut regions and forming second dielectric caps to fill the second undercut regions.

FIG. 15B is a cross-sectional view of the exemplary semiconductor structure of FIG. 15A along line B-B'.

FIG. 15C is a cross-sectional view of the exemplary semiconductor structure of FIG. 15A along line C-C'.

FIG. 15D is a cross-sectional view of the exemplary semiconductor structure of FIG. 15A along line D-D'.

DETAILED DESCRIPTION

Figure 5B:
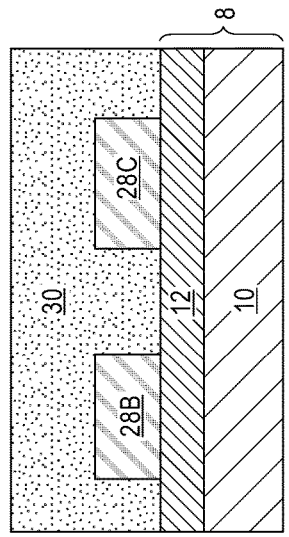
FIG. 5B is a cross-sectional view of the exemplary semiconductor structure of FIG. 4A along line B-B'.
Figure 5D:
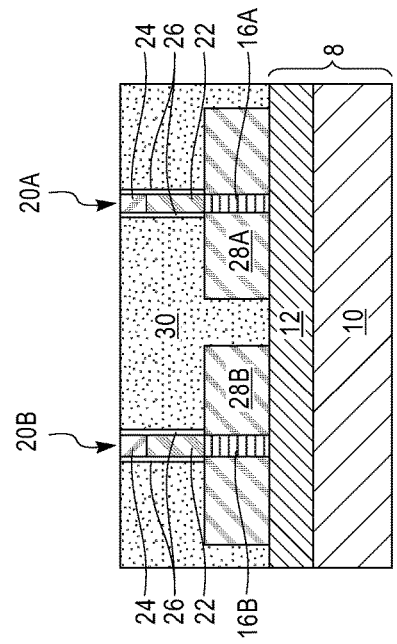
FIG. 5D is a cross-sectional view of the exemplary semiconductor structure of FIG. 5A along line D-D'.
Figure 5A:
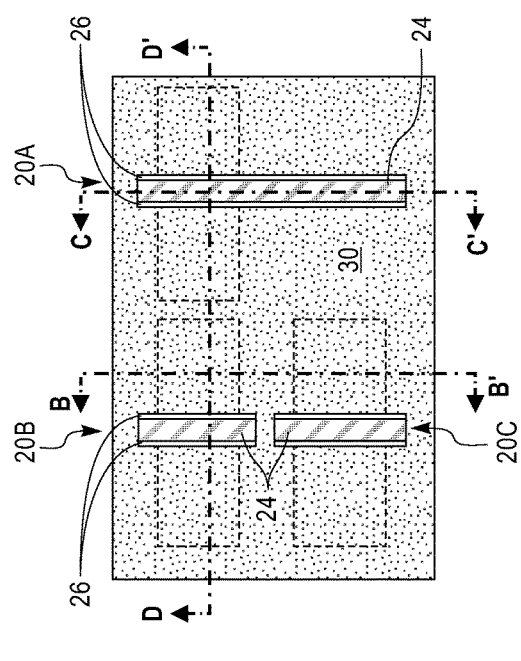
FIG. 5A is a top-down view of the exemplary semiconductor structure of FIGS. 4A-4D after forming an interlevel dielectric (ILD) layer laterally surrounding the first, the second and the third sacrificial gate stacks and the gate spacers.
Figure 5C:
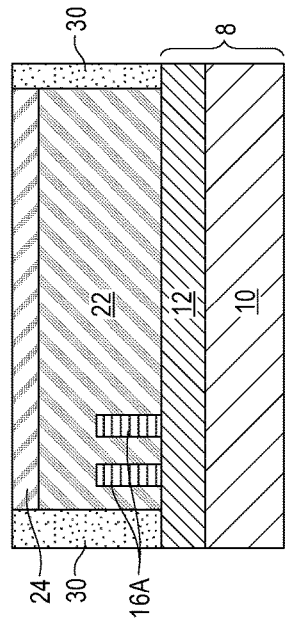
FIG. 5C is a cross-sectional view of the exemplary semiconductor structure of FIG. 5A along line C-C'.
Figure 6B:
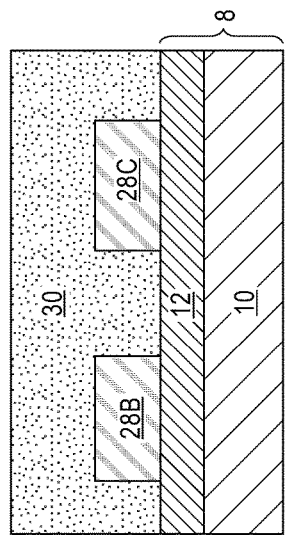
FIG. 6B is a cross-sectional view of the exemplary semiconductor structure of FIG. 6A along line B-B'.
Figure 6D:
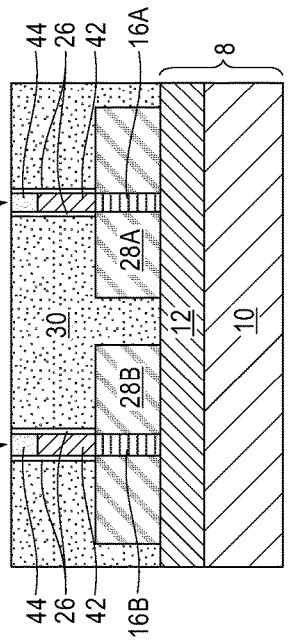
FIG. 6D is a cross-sectional view of the exemplary semiconductor structure of FIG. 6A along line D-D'.
Figure 6A:
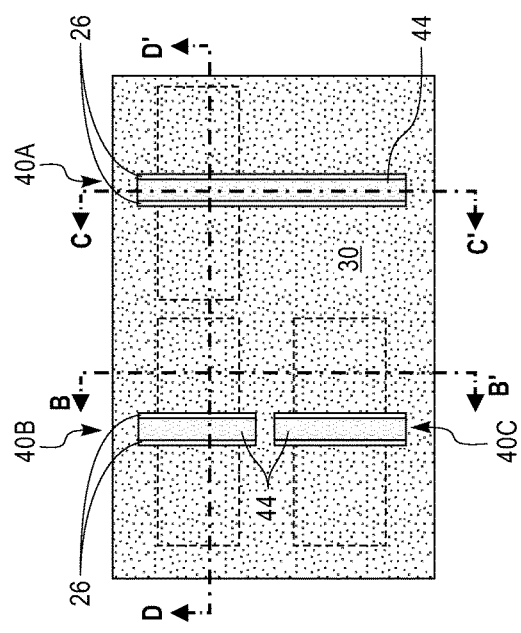
FIG. 6A is a top-down view of the exemplary semiconductor structure of FIGS. 5A-5D after forming a first functional gate stack, a second functional gate stack and a third functional gate stack.
Figure 6C:
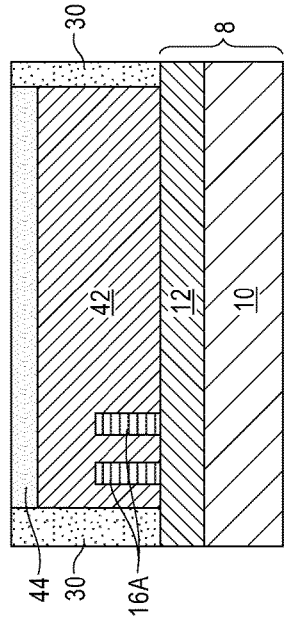
FIG. 6C is a cross-sectional view of the exemplary semiconductor structure of FIG. 6A along line C-C'.
Figure 7B:
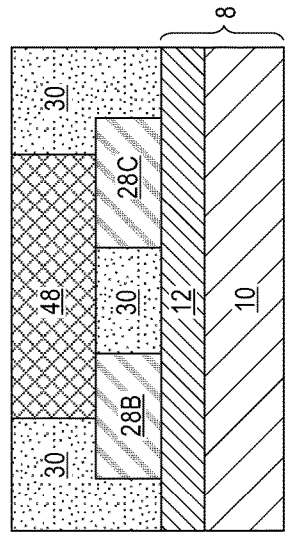
FIG. 7B is a cross-sectional view of the exemplary semiconductor structure of FIG. 7A along line B-B'.
Figure 7A:
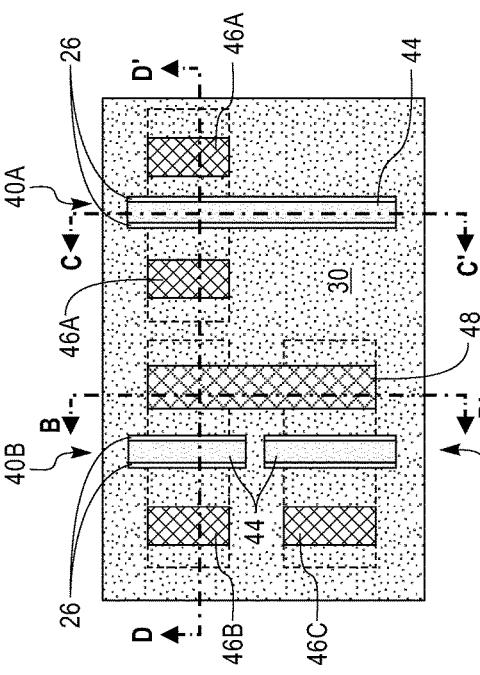
FIG. 7A is a top-down view of the exemplary semiconductor structure of FIGS. 6A-6D after forming various source/drain contact structures and a source/drain interconnect structure connecting one of the second source/drain regions and one of the third source/drain regions.
Figure 7D:
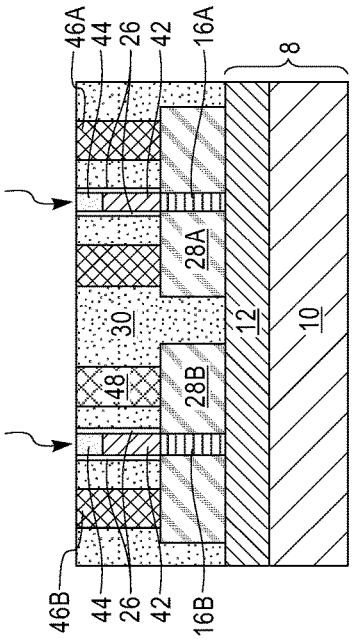
FIG. 7D is a cross-sectional view of the exemplary semiconductor structure of FIG. 7A along line D-D'.
Figure 7C:
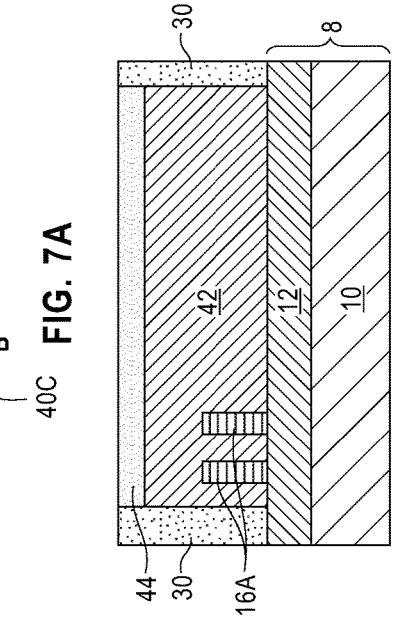
FIG. 7C is a cross-sectional view of the exemplary semiconductor structure of FIG. 7A along line C-C'.
Figure 8D:
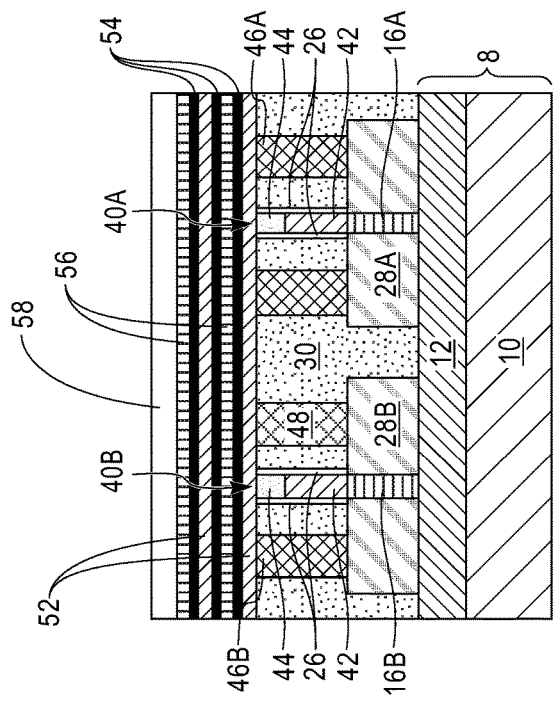
FIG. 8D is a cross-sectional view of the exemplary semiconductor structure of FIG. 8A along line D-D'.
Figure 8C:
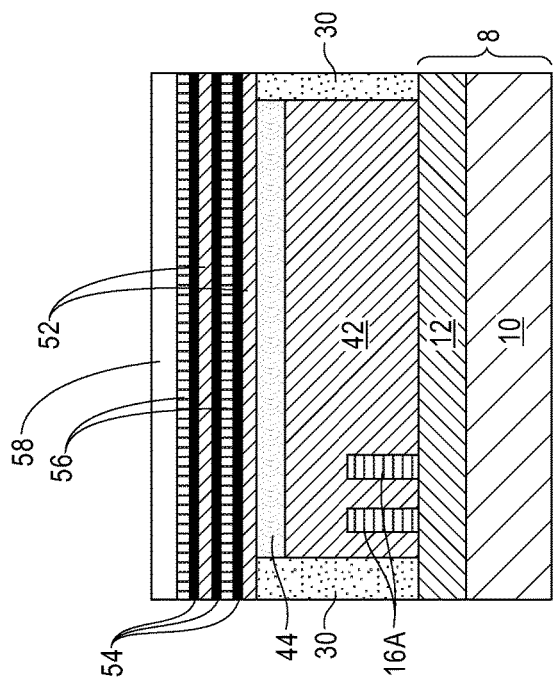
FIG. 8C is a cross-sectional view of the exemplary semiconductor structure of FIG. 8A along line C-C'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

FIG. 1 is a circuit diagram of a memory device including a plurality of memory unit cells 100 arranged in a crossbar configuration for achieving matrix-vector multiplication approximation operation. The crossbar includes a plurality of voltage lines, e.g., V1, V2, V3, V4 rows, and a plurality of current lines, I1, I2, I3, I4 columns. A set of input voltages $V_j$ are applied on voltage lines, and the current $I_i$ is collected through each current line. The current flowing through each current line is equal to the sum of the product of an input voltage $V_j$ and a crossbar weight value stored as the conductance $$g_{ij}, I_i = \sum_j g_{ij} \times V_j.$$

Each memory cell 100 in the memory device may include a charging transistor 102, a discharging transistor 104, a readout transistor 106 and a capacitor 108. In the present embodiment, the charging transistor 102 may be implemented as a p-type field effect transistor (pFET), the discharging transistor 104 may be implemented as an n-type FET (nFET), and the readout transistor 106 may be implemented as an nFET or a pFET. The charging transistor 102 has a source coupled to a supply voltage $V_{dd}$, a gate coupled to a first input line, and a drain coupled to node 114 that is coupled to a drain of the discharging transistor 104. A gate of the discharging transistor 104 is coupled to a second input line and a source of the discharging transistor 104 is coupled to ground. The readout transistor 106 has a source coupled to a voltage line (e.g., at point A), a drain coupled to a current line (e.g.) at point B and a gate coupled to node 116 that is coupled to node 114 and a first terminal of the capacitor 108. A second terminal of the capacitor 108 is coupled to ground.

The capacitor 108 thus is electrically connected to node 114 to receive a charging current from the charging transistor 102. As a result, a voltage at node 114 gradually increases due to the charging activity of the charging current. The capacitor 108 is discharged through the discharging transistor 104, causing the voltage at node 114 to drop down. The capacitor voltage is thus adjusted by charging and discharging. As the voltage of the capacitor 108 changes, the conductance of the readout transistor 106 changes continuously.

FIGS. 2-17 illustrate an exemplary method for fabricating a memory cell 100 described in FIG. 1.

Referring to FIGS. 2A-2C, there are illustrated various views of an exemplary semiconductor structure that can be employed according to an embodiment of the present application. The exemplary semiconductor structure includes a set of first semiconductor material portions 16A formed in a first active region (AT1) of a substrate 8, a set of second semiconductor material portions 16B formed in a second active region (AT2) of the substrate 8, and a set of third semiconductor material portions 16C formed in a third active region (AT3) of the substrate 8.

The active regions, i.e., areas where active FETs are to be formed, are arranged side by side such that the second active region AT2 is located adjacent to the first active region AT1 along a first direction X1, and adjacent to the third active region AT3 along a second direction Y1 that is perpendicular to the first direction X1. In one embodiment, the first and second active regions AT1, AT2 are nFET regions and the third active region AT3 is a pFET region. In some embodiments, the first active region AT1 can also be a pFET region.

In one embodiment, each semiconductor material portion 16A, 16B, 16C may be a semiconductor fin. The term "semiconductor fin" denotes a contiguous semiconductor structure that extends upward from a surface of a substrate (e.g., substrate 8) and has a pair of vertical sidewalls that are parallel to each other. As used herein, a surface is "vertical" if there exists a vertical plane from which the surface does not deviate by more than three times the root mean square roughness of the surface. The semiconductor fins are aligned in their lengthwise directions (i.e., along the first direction X1 and so the first direction X1 may be referred to hereinafter as the lengthwise direction of the fins) and spaced from each other in their widthwise directions (i.e., in the second direction Y1 so the second direction Y1 may also be referred to hereinafter as the widthwise direction of the fins). The height and width of the semiconductor fins can vary. For example, each semiconductor fin may have a height ranging from 10 nm to 100 nm, and a width ranging from 4 nm to 30 nm. In another embodiment, each semiconductor material portion 16A, 16B, 16C may be a semiconductor nanowire for forming nanowire FETs. In a further embodiment, each semiconductor material portion 16A, 16B, 16C may be a planar active semiconductor region for forming planar FETs.

In one embodiment, the semiconductor material portions 16A, 16B, 16C may be formed by providing a semiconductor-on-insulator (SOI) substrate including, from bottom to top, a handle substrate 10, a buried insulator layer 12, and a top semiconductor layer (not shown), and by patterning the top semiconductor layer. In this case, the buried insulator layer 12 and the handle substrate 10 constitute the substrate 8.

The handle substrate 10 may include a semiconductor material, such as, for example, Si, SiGe, SiGeC, SiC, an III-V compound semiconductor, an II-VI compound semiconductor, or any combinations thereof. Multilayers of semiconductor materials can also be used as the semiconductor material of the handle substrate 10. In one embodiment, the handle substrate 10 is composed of single crystalline silicon. The thickness of the handle substrate 10 can be from 50 μm to 2 mm, although lesser and greater thicknesses can also be employed.

The buried insulator layer 12 that is located on the handle substrate 10 may include a dielectric material such as silicon dioxide, silicon nitride, silicon oxynitride, or a combination thereof. The buried insulator layer 12 may be formed using a deposition process including, but not limited to, chemical vapor deposition (CVD), plasma enhanced chemical vapor deposition CVD (PECVD), or physical vapor deposition (PVD). Alternatively, the buried insulator layer 12 may be formed by thermal nitridation and/or thermal oxidation of a surface portion of the handle substrate 10. The buried insulator layer 12 may also be formed by implanting oxygen atoms into a bulk semiconductor substrate and thereafter annealing the structure. The thickness of the buried insulator layer 12 can be from 100 nm to 300 nm, although lesser and greater thicknesses can also be employed.

The top semiconductor layer may include any semiconductor material as mentioned above for the handle substrate 10. Exemplary semiconductor materials that can be employed as the top semiconductor layer include, but are not limited to, Si, Ge, SiGe, SiC, and SiGeC, and III/V compound semiconductors such as, for example, InAs, GaAs, and InP. The semiconductor materials of the top semiconductor layer and the handle substrate 10 may be the same or different. In one embodiment, the top semiconductor layer includes single crystalline silicon. The top semiconductor layer may be formed by CVD or PECVD. The thickness of the top semiconductor layer can be from 20 nm to 100 nm, although lesser or greater thicknesses can also be employed. Alternatively, the top semiconductor layer may be formed using a Smart Cut process where two semiconductor wafers are bonded together with an insulator in between.

The top semiconductor layer may be patterned using lithography and etching to provide the semiconductor material portions 16A, 16B, 16C. For example, a photoresist layer (not shown) can be applied over the top semiconductor layer and lithographically patterned to define a set of areas covered by a patterned photoresist layer. The top semiconductor layer is then patterned by an anisotropic etch using the patterned photoresist layer as an etch mask. In one embodiment, a dry etch such as, for example, reactive ion etch (RIE) can be used. In another embodiment, a wet etch using a chemical etchant can be used. In still a further embodiment, a combination of dry etch and wet etch can be used. After formation of the semiconductor material portions 16A, 16B, 16C, the patterned photoresist layer can be removed, for example, by ashing. Other methods known in the art, such as sidewall image transfer (SIT) or directional self-assembly (DSA), can also be used to pattern the top semiconductor layer of the SOI substrate to provide the semiconductor material portions 16A, 16B, 16C.

In another embodiment, the semiconductor material portions 16A, 16B, 16C may be formed by providing a bulk semiconductor substrate including a semiconductor material throughout, and by patterning an upper portion of the bulk semiconductor substrate. In this case, the remaining portion of the bulk semiconductor substrate underlying the semiconductor material portions 16A, 16B, 16C constitutes the substrate 8. The semiconductor material portions 16A, 16B, 16C are adjoined to the substrate 8 and are comprised of the same semiconductor material as mentioned above for the top semiconductor layer of the SOI substrate.

Referring to FIGS. 3A-3D, there are illustrated various views of the exemplary semiconductor structure of FIGS. 2A-2C after forming sacrificial gate stacks. The sacrificial gate stacks include a first sacrificial gate stack 20A straddling a channel region of each first semiconductor material portion 16A, a second sacrificial gate stack 20B straddling a channel region of each second semiconductor material portion 16B, and a third sacrificial gate stack 20C straddling a channel region of each third semiconductor material portion 16C. By "straddling" it is meant that the sacrificial gate stack formed in each active region is in direct contact with a top surface and two vertical sidewalls of the channel region of each semiconductor material portion. The term "sacrificial gate stack" is used throughout the present application to denote a material stack that serves as a placeholder material for a functional gate stack to be subsequently formed. The term "functional gate stack" as used herein refers to a permanent gate stack used to control output current (i.e., flow of carriers in the channel) of a semiconducting device through electrical fields or magnetic fields.

Each sacrificial gate stack 20A, 20B, 20C may include, from bottom to top, a sacrificial gate 22 and a sacrificial gate cap 24. The sacrificial gate 22 may include a sacrificial gate dielectric (not shown) and a sacrificial gate electrode (not shown).

The sacrificial gate stacks 20A, 20B, 20C may be formed by first providing a sacrificial material stack (not shown) that includes, from bottom to top, a sacrificial gate dielectric layer, a sacrificial gate electrode layer and a sacrificial gate cap layer over each semiconductor material portion 16A, 16B, 16C and the substrate 8, and by subsequently patterning the sacrificial material stack.

The sacrificial gate dielectric layer may include silicon oxide, silicon nitride, or silicon oxynitride. The sacrificial gate dielectric layer may be formed utilizing a conventional deposition process such as, for example, CVD or PVD. The sacrificial gate dielectric layer may also be formed by conversion of a surface portion of the semiconductor material portions 16A, 16B, 16C utilizing thermal oxidation or nitridation. The thickness of the sacrificial gate dielectric layer can be from 1 nm to 10 nm, although lesser and greater thicknesses can also be employed. In some embodiments of the present application, the sacrificial gate dielectric layer can be omitted.

The sacrificial gate electrode layer may include a semiconductor material such as polysilicon or a silicon-containing semiconductor alloy such as SiGe. The sacrificial gate electrode layer may be formed utilizing a conventional deposition process such as, for example, CVD or PECVD. The thickness of the sacrificial gate electrode layer can be from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is composed of silicon nitride. The sacrificial gate cap layer may be formed utilizing a conventional deposition process such as, for example, CVD or PECVD. The sacrificial gate cap layer that is formed may have a thickness from 10 nm to 200 nm, although lesser and greater thicknesses can also be employed.

The sacrificial material stack may be patterned by lithography and etching. For example, a photoresist layer (not shown) may be applied over the topmost surface of the sacrificial material stack and lithographically patterned by lithographic exposure and development. The pattern in the photoresist layer is sequentially transferred into the sacrificial material stack by at least one anisotropic etch. The anisotropic etch can be a dry etch such as, for example, RIE, a wet etch or a combination thereof. Each remaining portion of the sacrificial gate dielectric layer within a sacrificial gate stack 20A, 20B, 20B constitutes a sacrificial gate dielectric, each remaining portion of the sacrificial gate electrode layer within a sacrificial gate stack 20A, 20B, 20B constitutes a sacrificial gate electrode, and each remaining portion of the sacrificial gate cap layer within a sacrificial gate stack 20A, 20B, 20B constitutes a sacrificial gate cap. The remaining photoresist layer can be subsequently removed by, for example, ashing.

After forming the sacrificial gate stacks 20A, 20B, 20C, a gate spacer 26 is formed on sidewalls of each sacrificial gate stack 20A, 20B, 20C. Collectively, the first sacrificial gate stack 20A and a corresponding gate spacer 26 present on the sidewalls of the first sacrificial gate stack 20A can be referred to as a first sacrificial gate structure, the second sacrificial gate stack 20B and a corresponding gate spacer 26 present on the sidewalls of the second sacrificial gate stack 20B can be referred to as a second sacrificial gate structure, and the third sacrificial gate stack 20C and a corresponding gate spacer 26 present on the sidewalls of the third sacrificial gate stack 20C can be referred to as a third sacrificial gate structure.

Each gate spacer 26 may include a dielectric material such as, for example, an oxide, a nitride, an oxynitride, or any combination thereof. In one embodiment, each gate spacer 26 is composed of silicon nitride. The gate spacers 26 may be formed by first providing a conformal gate spacer material layer (not shown) on physically exposed surfaces of each sacrificial gate stack 20A, 20B, 20C, each semiconductor material portion 16A, 16B, 16C and the substrate 8 and then etching the gate spacer material layer to remove horizontal portions of the gate spacer material layer. The gate spacer material layer may be provided by a deposition process including, for example, CVD, PECVD or atomic layer deposition (ALD). The etching of the gate spacer material layer may be performed by a dry etch process such as, for example, RIE. A remaining vertical portion of the gate spacer material layer that is present on the sidewalls of each sacrificial gate stack 20A, 20B, 20C constitutes a gate spacer 26. The width of each gate spacer 26, as measured at the base, can be from 5 nm to 100 nm, although lesser and greater widths can also be employed.

Referring to FIGS. 4A-4D, there are illustrated various views of the exemplary semiconductor structure of FIGS. 3A-3D after forming source/drain regions. The source/drain regions include a first source region and a first drain region (collectively referred to as first source/drain regions 28A) formed on opposite sides of the first sacrificial gate structure (20A, 26), a second source region and a second drain region (collectively referred to as second source/drain regions 28B) formed on opposite sides of the second sacrificial gate structure (20B, 26) and a third source region and a third drain region (collectively referred to as third source/drain regions 28C) formed on opposite sides of the third sacrificial gate structure (20C, 26). The first source/drain regions 28A merge the first semiconductor material portions 16A, the second source/drain regions 28B merge the second semiconductor material portions 16B, and the third source/drain regions 28C merge the third semiconductor material portions 16C.

In one embodiment and when the first and second source/drain regions 28A, 28B are implemented for nFETs and the third source/drain regions 28C are implemented for a pFET, the first and second source/drain regions 28A, 28B may be formed by a first selective epitaxial growth process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. For example, a first mask layer (not shown) is applied over the structure of FIGS. 3A-3D and lithographically patterned to form a first mask (not shown) that covers the third active region AT3, while exposing the first and second active regions AT1, AT2. The first mask layer can be a photoresist layer or a photoresist layer in conjunction with hardmask layer(s). The first and second source/drain regions 28A, 28B are then formed by epitaxially depositing a first semiconductor material on physically exposed surfaces of the first semiconductor material portions 16A that are not covered by the first sacrificial gate structure (20A, 26) and the second semiconductor material portions 16B that are not covered by the second sacrificial gate structure (20B, 26), but not on dielectric surfaces such as the surfaces of the sacrificial gate caps 24 and the gate spacers 26, the buried insulator layer 12 and the first mask. The first semiconductor material that provides the first and second source/drain regions 28A, 28B may include Si or carbon doped silicon (Si:C). The first and second source/drain regions 28A, 28B also contain n-type dopants for formation of nFETs. Examples of n-type dopants include, but are not limited to, P, As or Sb. Dopants may be introduced into the first and second source/drain regions 28A, 28B by in-situ doping during the first epitaxial growth process or by ex-situ doping after the first epitaxial growth process utilizing ion implantation. After formation of the first and second source/drain regions 28A, 28B, the first mask can be removed, for example, by oxygen-based plasma etching.

Similarly, the third source/drain regions 28C may be formed by a second selective epitaxial growth process. For example, a second mask (not shown) is first formed to cover the first and second active regions AT1, AT2, while exposing the third active region AT3. A second semiconductor material is then epitaxially deposited on physically exposed surfaces of the third semiconductor material portions 16C that are not covered by the third sacrificial gate structure (20C, 26). The second semiconductor material that provides the third source/drain regions 28C may include SiGe. The third source/drain regions 28C contain p-type dopants for formation of a pFET. Examples of p-type dopants include, but are not limited to, B, Al, Ga or In. Dopants may be introduced into the third source/drain regions 28C by in-situ doping during the second epitaxial growth process or by ex-situ doping after the second epitaxial growth process utilizing ion implantation. After formation of the third source/drain regions 28C, the second mask can be removed, for example, by oxygen-based plasma etching.

In another embodiment and when the first and third source/drain regions 28A, 28C are implemented for pFETs and the second source/drain regions 28C are implemented for an nFET, the first and third source/drain regions 28A, 28c may be formed by the second selective epitaxial growth process described above and the second source/drain regions 28C may be formed by the first selective epitaxial growth process described above.

Referring to FIGS. 5A-5D, there are illustrated various views of the exemplary semiconductor structure of FIGS. 4A-4D after forming an interlevel dielectric (ILD) layer 30 over the source/drain regions 28A, 28B, 28C and the buried insulator layer 12. The ILD layer 30 laterally surrounds the sacrificial gate stacks 20A, 20B, 20C and the gate spacers 26. The ILD layer 30 may include a dielectric material that can be easily planarized. For example, the ILD layer 30 can be a doped silicate glass, an undoped silicate glass (silicon oxide), an organosilicate glass (OSG), or a porous dielectric material. The ILD layer 30 may be formed by CVD, PVD or spin coating. The ILD layer 30 can be initially formed such that an entirety of the top surface of the ILD layer 30 is formed above the topmost surfaces of the sacrificial gate stacks 20A, 20B, 20C (i.e., top surfaces of the sacrificial gate caps 24). The ILD layer 30 can be subsequently planarized, for example, by chemical mechanical planarization (CMP) and/or a recess etch using the sacrificial gate caps 24 as a polishing and/or an etch stop. After the planarization, the ILD layer 30 has a top surface coplanar with the top surfaces of the sacrificial gate caps 24.

Referring to FIGS. 6A-6D, there are illustrated various views of the exemplary semiconductor structure of FIGS. 5A-5D after replacing the first sacrificial gate stack 20A, the second sacrificial gate stack 20B and the third sacrificial gate stack 20C with a first functional gate stack 40A, a second functional gate stack 40B and a third functional gate stack 40C, respectively. As shown, the first functional gate stack 40A is formed in the first active region AT1 straddling the channel region of each first semiconductor material portion 16A, the second functional gate stack 40B is formed in the second active region AT2 straddling the channel region of each second semiconductor material portion 16B, and the third functional gate stack 40C is formed in the third active region AT3 straddling the channel region of each third semiconductor material portion 16C. Each functional gate stack 40A, 40B, 40C is laterally surrounded by a gate spacer 26. Collectively, one of the functional gate stacks 40A, 40B, 40C and a corresponding gate spacer 26 can be referred to as a functional gate structure.

Each function gate stack 40A, 40B, 40C, may include, from bottom to top, a functional gate 42 and a gate cap 44. As is shown, the top surface of each gate cap 44 is coplanar with the top surface of the ILD layer 30. The functional gate 42 may include a U-shaped gate dielectric (not shown), and a gate electrode (not shown) surrounded by the gate dielectric. By "U-shaped" it is meant a structure that includes a horizontal portion and two vertical extending portions that extend upwards from each end of the horizontal portion.

The gate dielectric may include any gate dielectric material. The gate dielectric material that provides the gate dielectric can be an oxide, nitride, and/or oxynitride. In one example, the gate dielectric material that provides the gate dielectric 42 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric may be formed and used as the gate dielectric. The gate dielectric may be formed by any deposition process including, for example, CVD, PECVD, PVD or ALD. The thickness of the gate dielectric can be from 1 nm to 10 nm, although lesser and greater thicknesses can also be employed.

The gate electrode may include a conductive metal such as, for example, Al, Au, Ag, Cu, Co or W. The gate electrode may be formed utilizing a deposition process including, for example, CVD, PECVD, PVD or ALD.

Optionally, in some embodiments of the present application, a U-shaped work function metal (not shown) may be formed between the gate dielectric and the gate electrode to tune the threshold voltage of the FETs to be formed. The work function metal may be formed, for example, by CVD, PVD, or ALD. The thickness of the work function metal can be from 1 nm to 10 nm, although lesser or greater thicknesses can also be employed.

The replacement of each sacrificial gate stack 20A, 20B, 20C includes removing components of each sacrificial gate stack 20A, 20B, 20C utilizing an etching process and thereafter a functional gate stack 40A, 40B, 40C is formed in a gate cavity that comprises a volume of each removed sacrificial gate stack 20A, 20B, 20C. The formation of each functional gate stack 40A, 40B, 40C includes depositing a gate dielectric material and a gate electrode material that provide each functional gate stack 40A, 40B, 40C and performing a planarization process such as, for example, CMP, to remove the deposited gate dielectric material and gate electrode material from above the top surface of the ILD layer 30. After planarization, the deposited gate dielectric material and gate electrode material are recessed to provide a gate dielectric and a gate electrode (i.e., a functional gate 42) within each gate cavity. A dielectric material is then deposited on top of the functional gate 42 to provide a gate cap 44 within each gate cavity.

Thus, a first FET is formed in the first active region AT1 of the substrate 8, a second FET is formed in the second active region AT2 of the substrate 8, and a third FET is formed in the third active region AT3 of the substrate 8. In one embodiment of the present application, the first FET can be an nFET or a pFET, the second FET can be an nFET, and the third FET can be a pFET. The first FET is implemented as the readout transistor, the second FET is implemented as the discharging transistor and the third FET is implemented as the charging transistor. The first FET includes a first functional gate structure containing a first functional gate stack 40A straddling a channel region of each first semiconductor material portion 16A and a corresponding gate spacer 26 present on sidewalls of the first function gate stack 40A, and first source/drain regions 28A present on opposite sides of the first functional gate structure (40A, 26) merging the first semiconductor material portion 16A. The second FET includes a second functional gate structure containing a second functional gate stack 40B straddling a channel region of each second semiconductor material portion 16B and a corresponding gate spacer 26 present on sidewalls of the second function gate stack 40B, and second source/drain regions 28B present on opposite sides of the second functional gate structure (40B, 26) and merging the second semiconductor material portions 16B. The third FET includes a third functional gate structure containing a third functional gate stack 40C straddling a channel region of each third semiconductor material portion 16C and a corresponding gate spacer 26 present on sidewalls of the third function gate stack 40C, and third source/drain regions 28C present on opposite sides of the third functional gate structure (40B, 26) and merging the third semiconductor material portions 16C.

Referring to FIGS. 7A-7D, there are illustrated various views of the exemplary semiconductor structure of FIGS. 6A-6D after forming various source/drain contact structures and a source/drain interconnect structure 48 over source/drain regions 28A, 28B, 28C. The source/drain contact structures include first source/drain contact structures 46A contacting the first source/drain regions 28A, a second source/drain contact structure 46B contacting one of the second source/drain regions 28B located on a first side of the second functional gate stack 40B, a third source/drain contact structure 46C contacting one of the third source/drain regions 28C located on a first side of the third functional gate stack 40C. The source/drain interconnect structure 48 connects the other of the second source/drain regions 28B located on a second side of the second functional gate stack 40B opposite the first side and the other of the third source/drain regions 28C located on a second side of the third functional gate stack 40C, 26 opposite the first side. In one embodiment, the first side of each of the second functional gate stack 40B and the third functional gate stack 40C is distal from the first functional gate stack 40A, and the second side of each of the second functional gate stack 40B and the third functional gate stack 40C is proximal to the first functional gate stack 40A.

The source/drain contact structures 46A, 46B, 46C and the source/drain interconnect structure 48 can be formed by first forming source/drain contact openings (not shown) and a source/drain interconnect opening (not shown) extending through the ILD layer 30, exposing a portion of a corresponding source/drain region 28A, 28B, 28C. The source/drain contact and interconnect openings can be formed by applying a mask layer (not shown) over the ILD layer 30, the functional gate stacks 40A, 40B, 40C and the gate spacers 26, and then lithographically patterning the mask layer to form openings therein. Each opening overlies a portion of a corresponding source/drain region 28A, 28B, 28C. The mask layer can be a photoresist layer or a photoresist layer in conjunction with hardmask layer(s). The pattern in the mask layer is transferred through the ILD layer 30 by an anisotropic etch to form the source/drain contact openings and the source/drain interconnect opening. The anisotropic etch can be a dry etch such as RIE or a wet etch that etches the ILD layer 30 selective to the source/drain regions 28A, 28B, 28C. After forming the source/drain contact openings and the source/drain interconnect opening, the remaining mask layer can be removed by oxygen-based plasma etching.

Subsequently, a conductive material is deposited within the source/drain contact openings and the source/drain interconnect opening. The conductive material may include a metal such as, for example, W, Al, Cu or their alloys. The conductive material may be deposited by any suitable deposition method such as, for example, CVD, PVD or plating. Excess portions of the deposited conductive material can be removed from above the top surface of the ILD layer 30 by a planarization process such as, for example, CMP to provide the final source/drain contact structures 46A, 46B, 46C and the source/drain interconnect structure 48. Optionally, contact liners (not shown) may be formed on the sidewalls and bottom surfaces of the source/drain contact openings and the source/drain interconnect opening before filling the openings with the conductive material. In one embodiment, the contact liners may include TiN.

Referring to FIGS. 8A-8D, there are illustrated various views of the exemplary semiconductor structure of FIGS. 7A-7D after forming a MIM stack on the source/drain contact structures 46A, 46B, 46C, the source/drain interconnect structure 48, the functional gate stacks 40A, 40B, 40C, the gate spacers 26 and the ILD layer 30. The MIM stack may include alternating first metal layers 52 and second metal layers 56 that are separated from each other by capacitor dielectric layers 54. The MIM stack (52, 54, 56) may include any number of first and second metal layers 52, 56. In one embodiment and as shown, the MIM stack (52, 54, 56) includes two first metal layers 52, two second metal layers 56 and three capacitor dielectric layers 54 isolated each first metal layer 52 from the next adjacent second metal layer 56. All capacitor dielectric layers 54 of the MIM stack can be the same dielectric material, or some or each capacitor dielectric layer 54 can comprise different dielectric materials. Similarly, all capacitor dielectric layers 54 can be formed by the same deposition process, or some or each capacitor dielectric layer 54 can be formed by different deposition processes. All first metal layers 52 can be, but are not necessarily, the same material, so long as all of the first metal layers 52 can be selectively etched relative to all the second metal layers by a single etch. Similarly, all second metal layers 56 can be, but are not necessarily, the same material, so long as all of the second metal layers 56 can be selectively etched relative to all the first metal layers 52 by a single etch.

Each first metal layer 52 may include a conductive metal such as, for example, TiN, TaN, Ti, Ta, Cu, Ru, or the like. Each first metal layer 52 may be formed utilizing a deposition process including, for example, CVD, PECVD, PVD or ALD. The thickness of each first metal layer 30 can be from 1 nm to 25 nm, although lesser and greater thicknesses can also be employed.

Each capacitor dielectric layer 54 may include a high-k dielectric material (i.e., a dielectric material having a dielectric constant that is greater than the dielectric constant of silicon dioxide). Exemplary capacitor dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof and an alloy thereof. Each value of x is independently from 0.5 to 3 and each value of y is independently from 0 to 2. Each capacitor dielectric layer 54 may be formed by any conformal deposition process including, for example, CVD, PECVD or ALD. The thickness of each capacitor dielectric layer 66 can be from 1 nm to 10 nm, although lesser and greater thicknesses can also be employed.

Each second metal layer 56 may include a conductive metal different from the conductive metal that provides each first metal layer 52. For example, each second metal layer 56 may include TiN, TaN, Ti, Ta, Cu, Ru, or the like. Each second metal layer 56 may be formed utilizing a deposition process including, for example, CVD, PECVD, PVD or ALD. The thickness of each second metal layer 56 can be from 1 nm to 25 nm, although lesser and greater thicknesses can also be employed.

After formation of the MIM stack (52, 54, 56), an insulator layer 58 is deposited on the topmost surface of the MIM stack (52, 54, 56). The insulator layer 58 may include a dielectric nitride such as, for example, silicon nitride, SiBCN, SiOCN or SiCN. The insulator layer 58 may be formed by CVD, PECVD or ALD. The thickness of the insulator layer 58 can be from 30 nm to 100 nm, although lesser and greater thicknesses can also be employed.

Figure 9D:
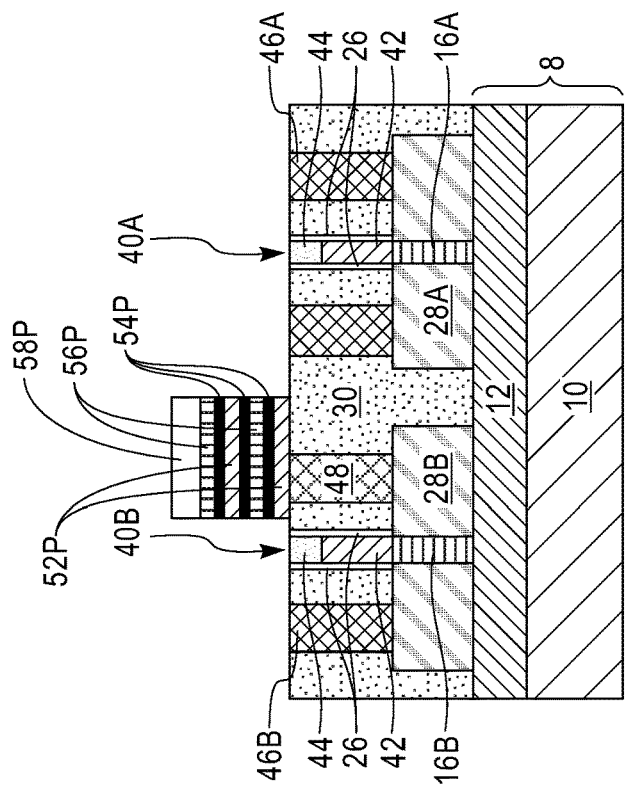
FIG. 9D is a cross-sectional view of the exemplary semiconductor structure of FIG. 9A along line D-D'.
Figure 9C:
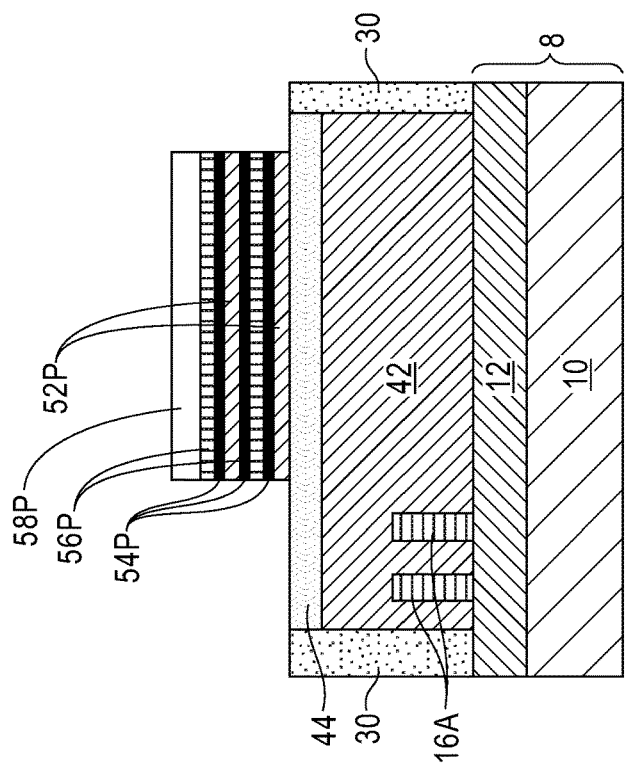
FIG. 9C is a cross-sectional view of the exemplary semiconductor structure of FIG. 9A along line C-C'.
Figure 10B:
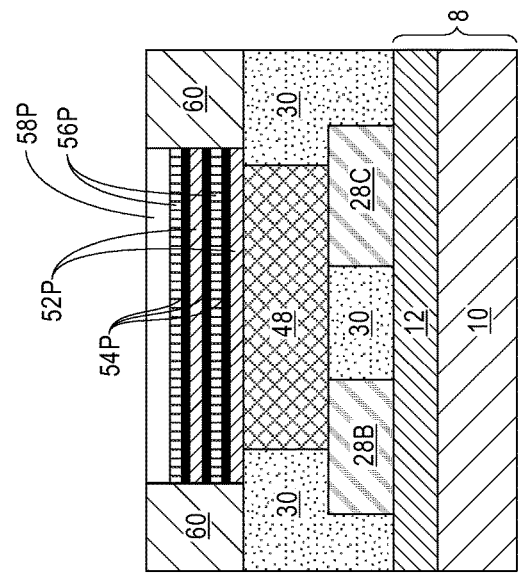
FIG. 10B is a cross-sectional view of the exemplary semiconductor structure of FIG. 10A along line B-B'.
Figure 10A:
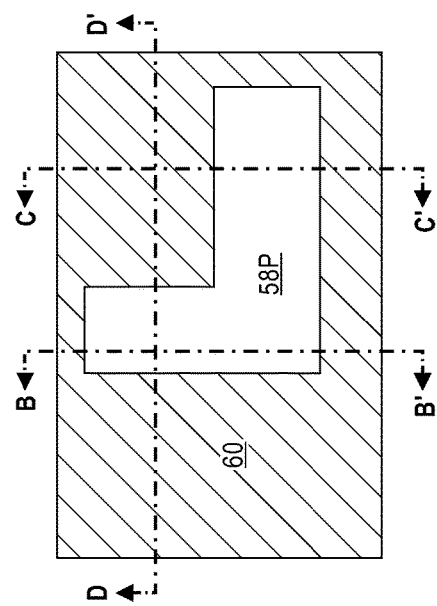
FIG. 10A is a top-down view of the exemplary semiconductor structure of FIGS. 9A-9D after forming a contact level dielectric layer on the ILD layer to laterally surround the MIM capacitor and the insulator portion.
Figure 10D:
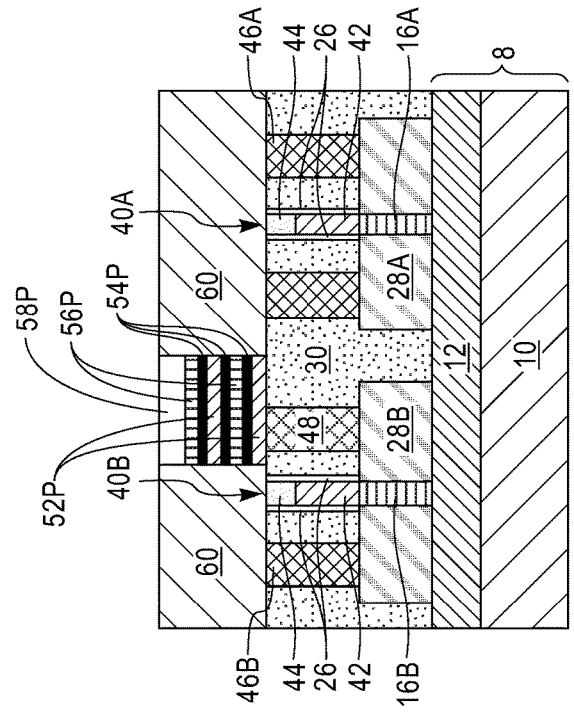
FIG. 10D is a cross-sectional view of the exemplary semiconductor structure of FIG. 10A along line D-D'.
Figure 10C:
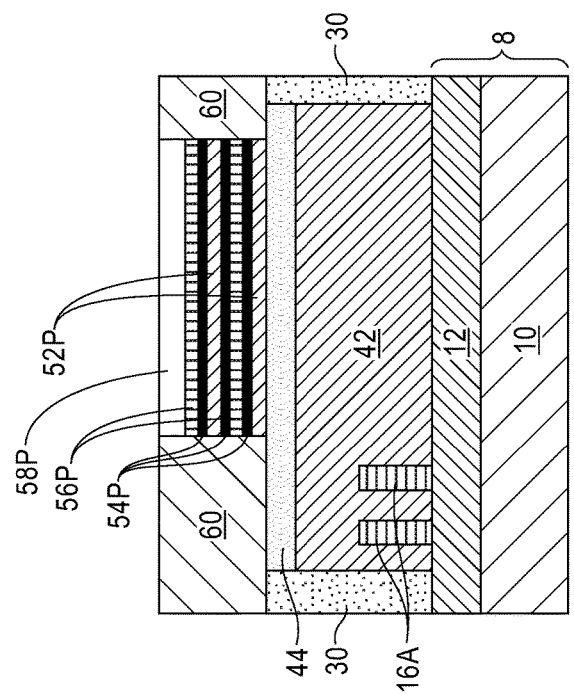
FIG. 10C is a cross-sectional view of the exemplary semiconductor structure of FIG. 10A along line C-C'.
Figures 11A, 11B:
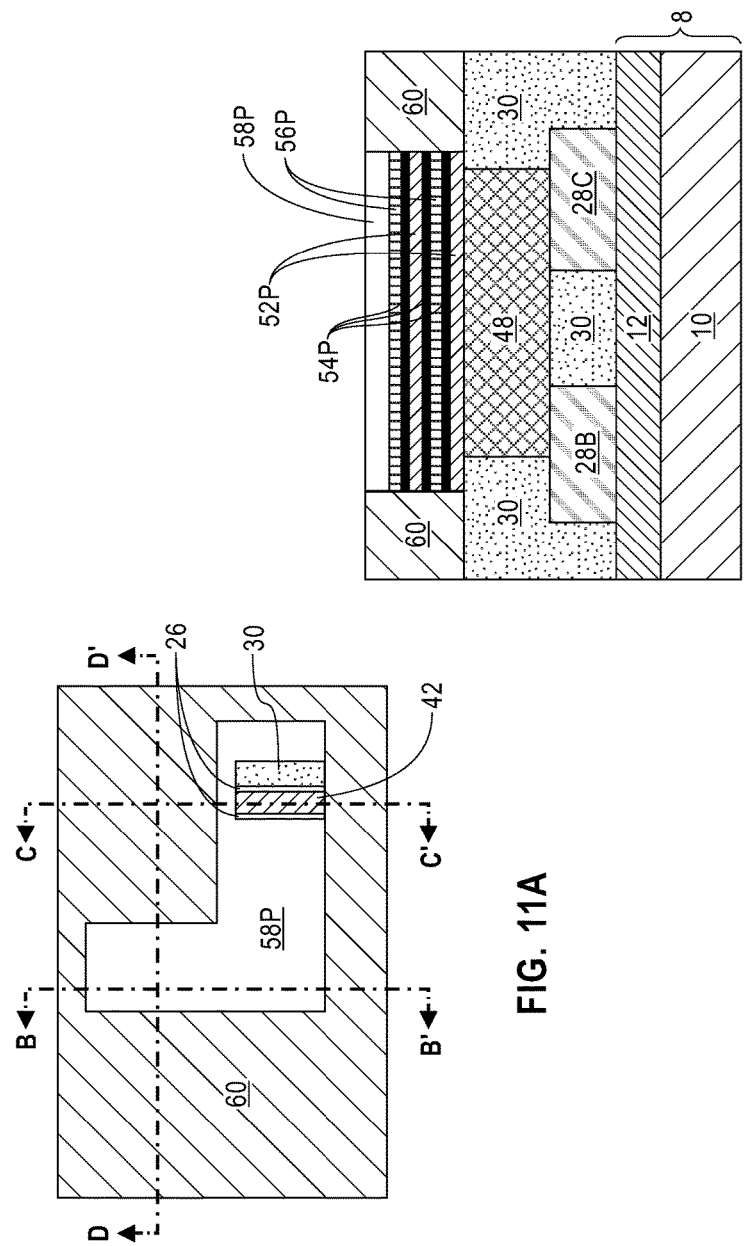
FIG. 11A is a top-down view of the exemplary semiconductor structure of FIGS. 10A-10D after forming a first opening exposing a surface of the functional gate of the first functional gate stack and sidewalls of the MIM capacitor located at a first end of the MIM capacitor.
FIG. 11B is a cross-sectional view of the exemplary semiconductor structure of FIG. 11A along line B-B'.
Figure 11D:
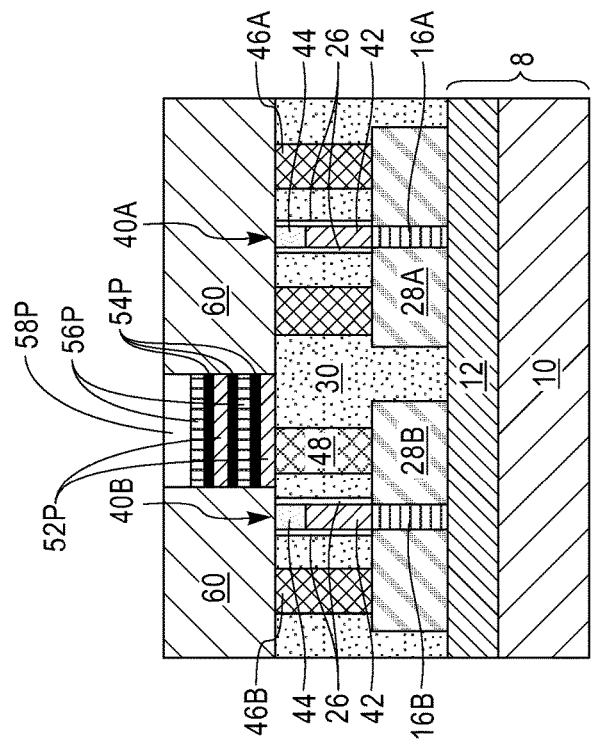
FIG. 11D is a cross-sectional view of the exemplary semiconductor structure of FIG. 11A along line D-D'.
Figure 11C:
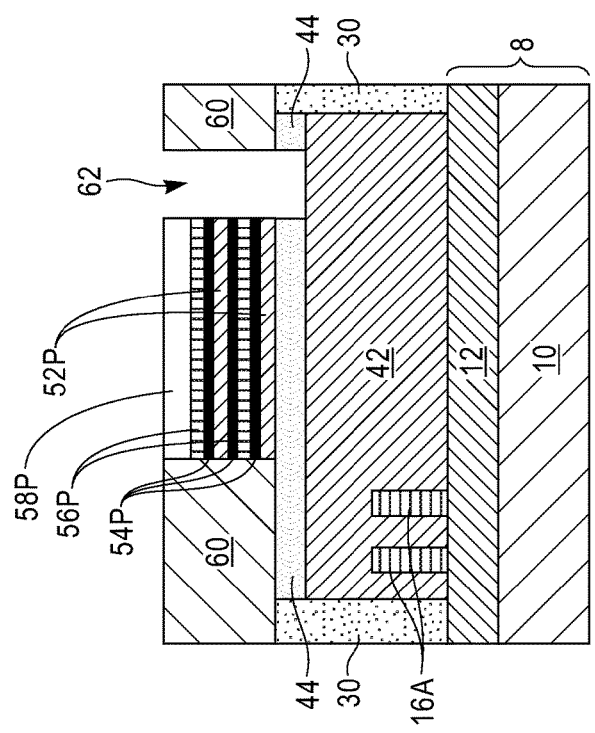
FIG. 11C is a cross-sectional view of the exemplary semiconductor structure of FIG. 11A along line C-C'.
Figure 13A:
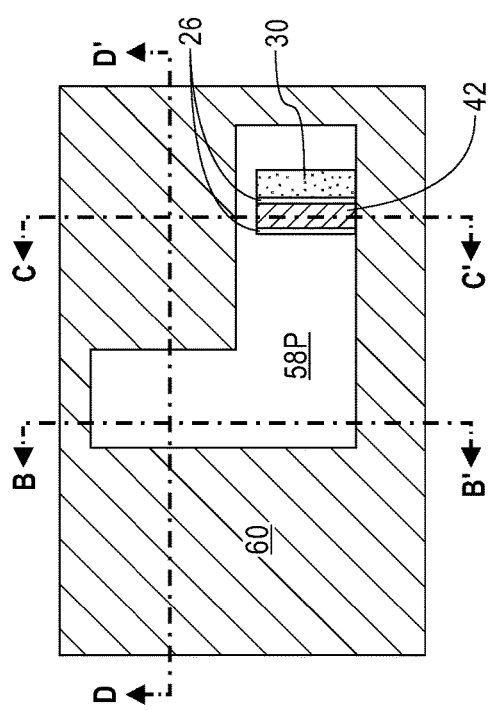
FIG. 13A is a top-down view of the exemplary semiconductor structure of FIGS. 12A-12D after forming first dielectric caps to fill the first undercut regions.
Figure 13B:
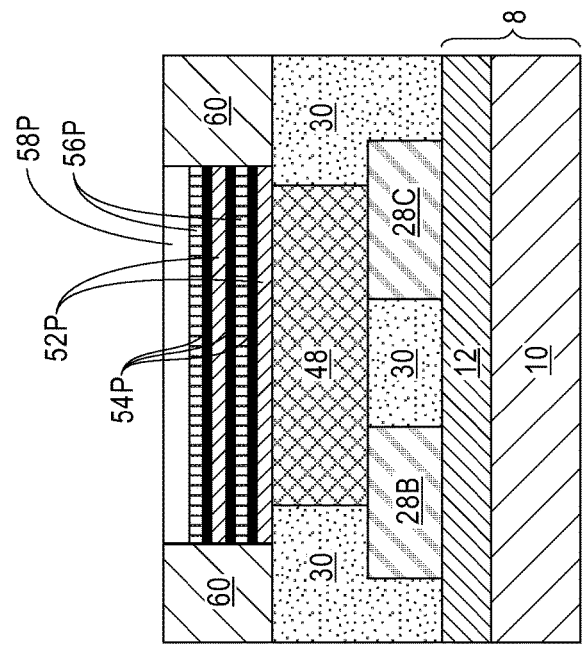
FIG. 13B is a cross-sectional view of the exemplary semiconductor structure of FIG. 13A along line B-B'.
Figures 13C, 13D:
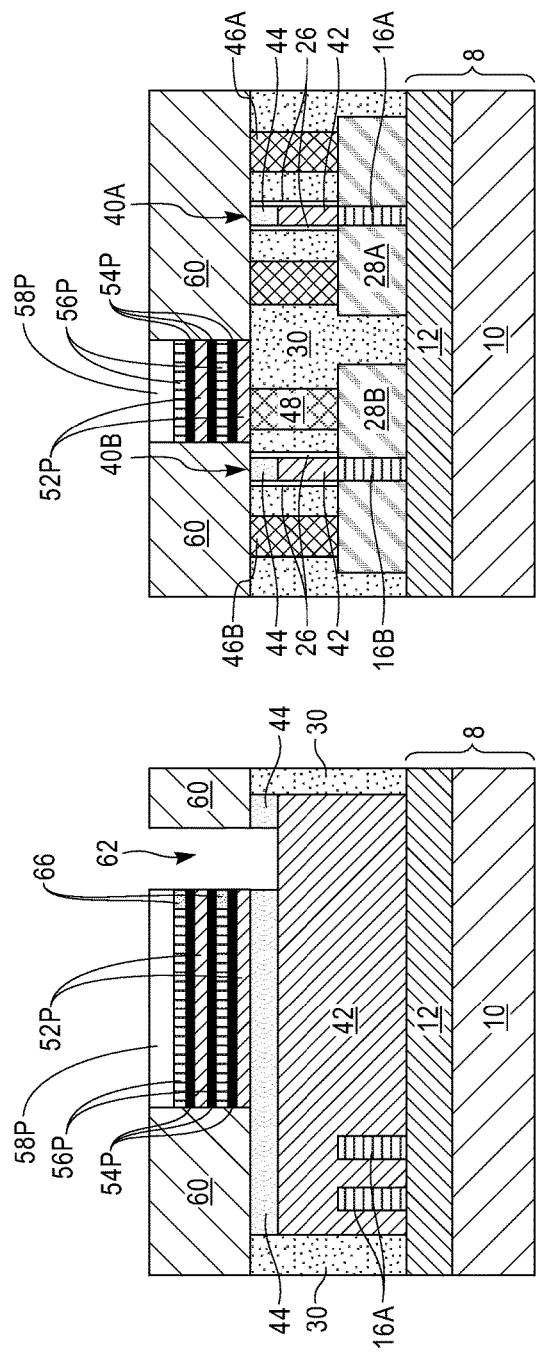
FIG. 13C is a cross-sectional view of the exemplary semiconductor structure of FIG. 13A along line C-C'.
FIG. 13D is a cross-sectional view of the exemplary semiconductor structure of FIG. 13A along line D-D'.
Figure 14A:
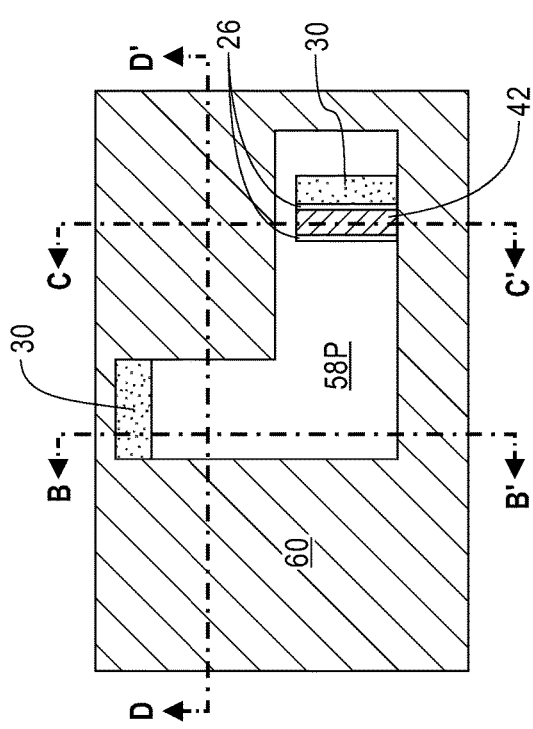
FIG. 14A is a top-down view of the exemplary semiconductor structure of FIGS. 13A-13D after forming a second opening exposing a surface of the ILD layer and sidewalls of the MIM capacitor located at a second end of the MIM capacitor wherein the source/drain interconnect structure is located.
Figure 14B:
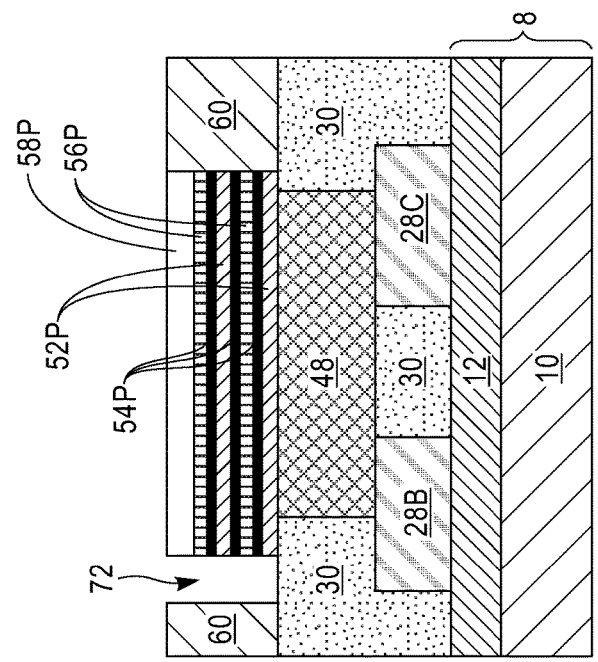
FIG. 14B is a cross-sectional view of the exemplary semiconductor structure of FIG. 14A along line B-B'.
Figure 14D:
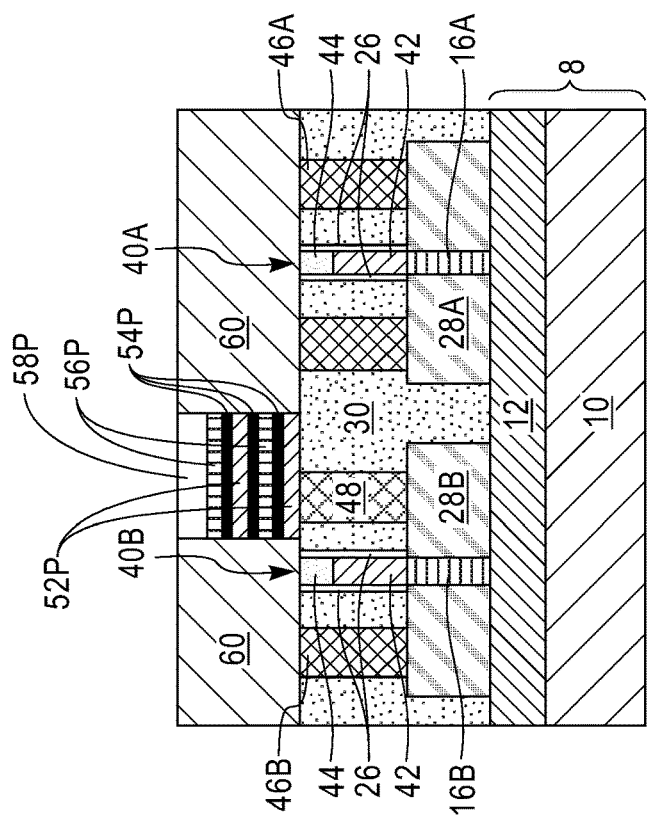
FIG. 14D is a cross-sectional view of the exemplary semiconductor structure of FIG. 14A along line D-D'.
Figure 14C:
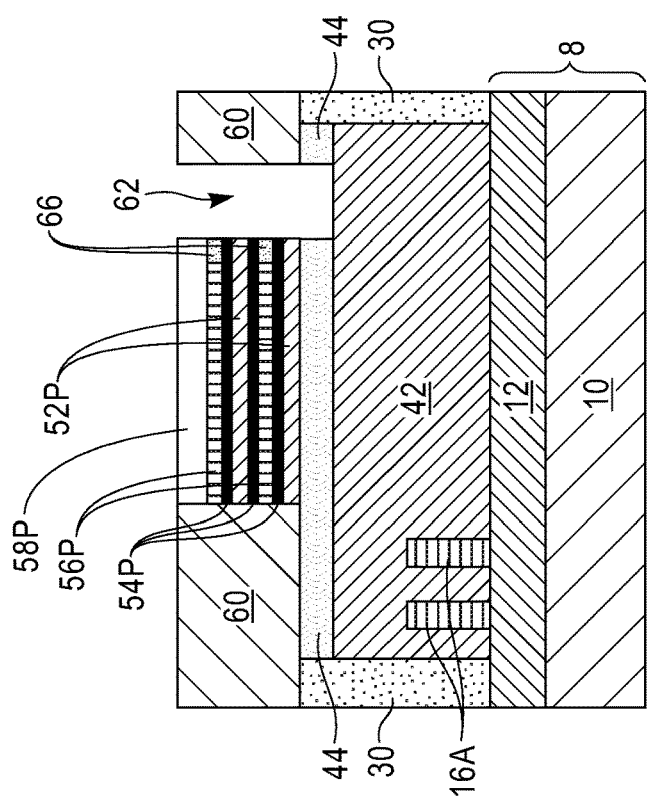
FIG. 14C is a cross-sectional view of the exemplary semiconductor structure of FIG. 14A along line C-C'.
Figure 16B:
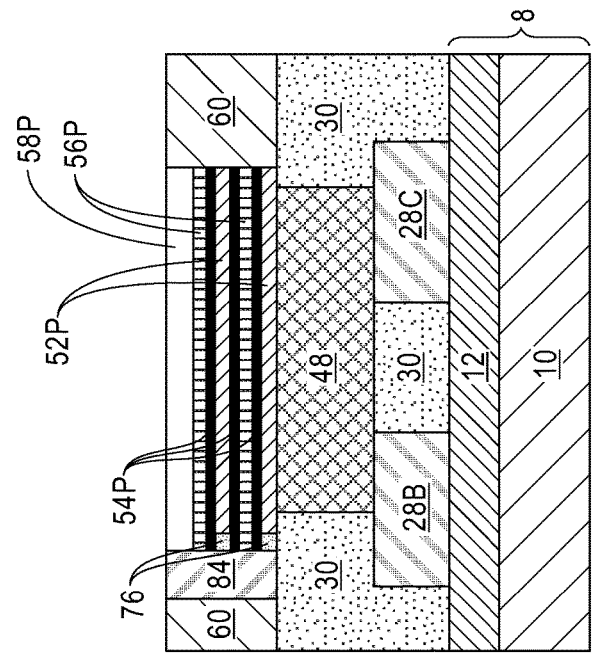
FIG. 16B is a cross-sectional view of the exemplary semiconductor structure of FIG. 16A along line B-B'.
Figure 16A:
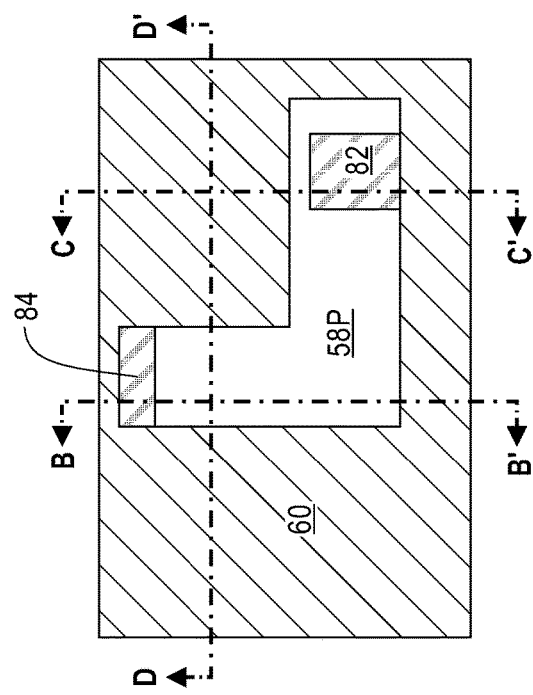
FIG. 16A is a top-down view of the exemplary semiconductor structure of FIGS. 15A-15D after forming a first capacitor contact structure within the first opening and a second capacitor contact structure within the second opening.
Figure 16D:
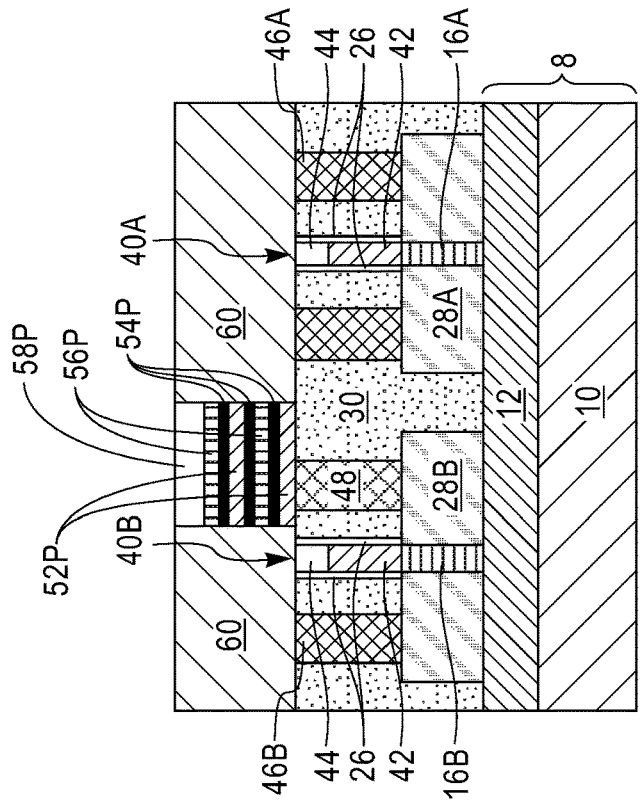
FIG. 16D is a cross-sectional view of the exemplary semiconductor structure of FIG. 16A along line D-D'.
Figure 16C:
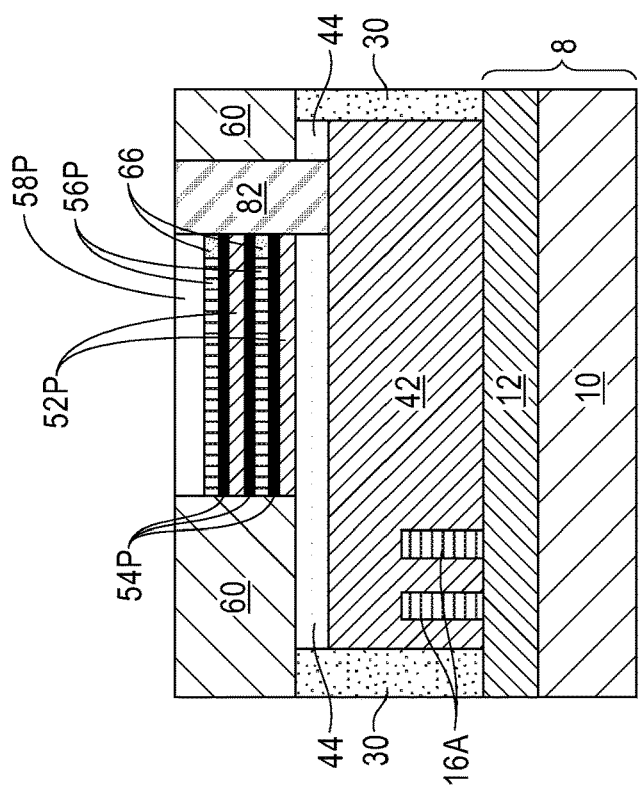
FIG. 16C is a cross-sectional view of the exemplary semiconductor structure of FIG. 16A along line C-C'.
Figure 17B:
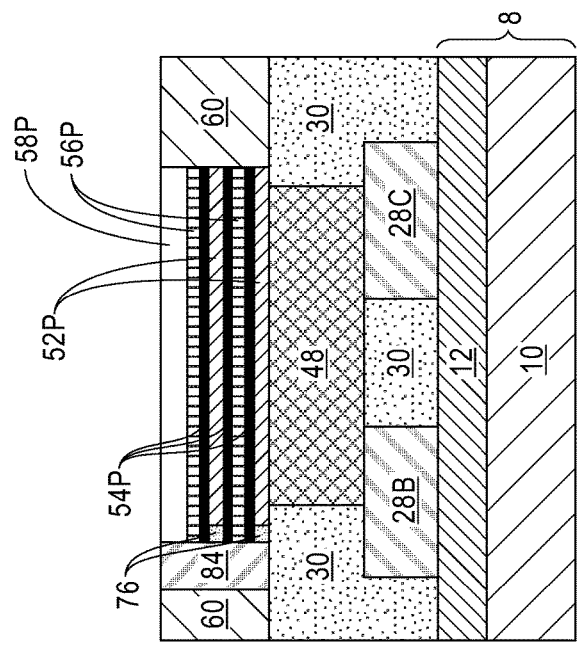
FIG. 17B is a cross-sectional view of the exemplary semiconductor structure of FIG. 17A along line B-B'.
Figure 17A:
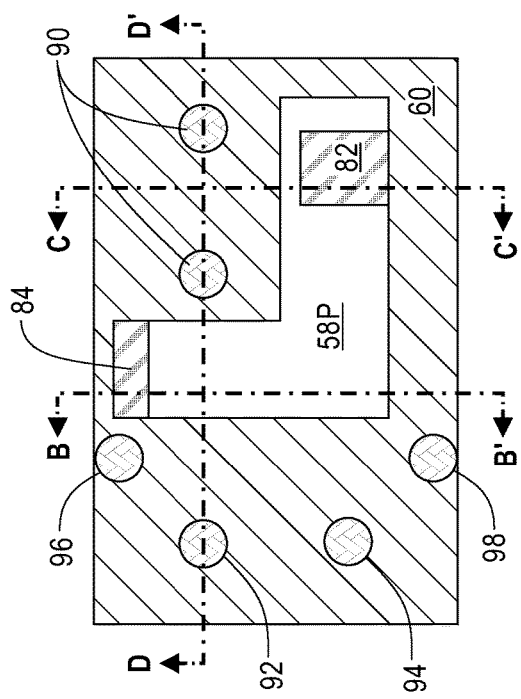
FIG. 17A is a top-down view of the exemplary semiconductor structure of FIGS. 16A-16D after forming various contact structures to FET components.
Figure 17D:
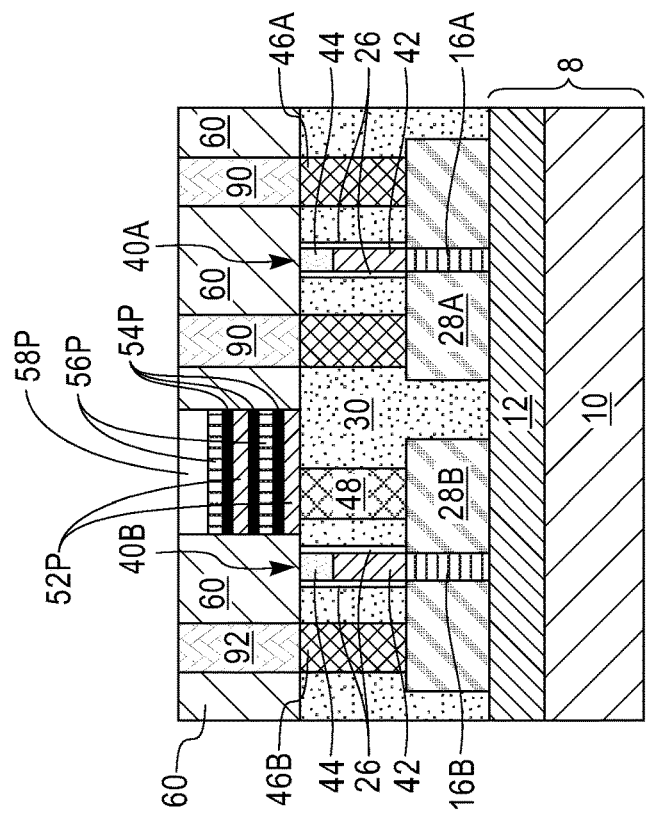
FIG. 17D is a cross-sectional view of the exemplary semiconductor structure of FIG. 17A along line D-D'.
Figure 17C:
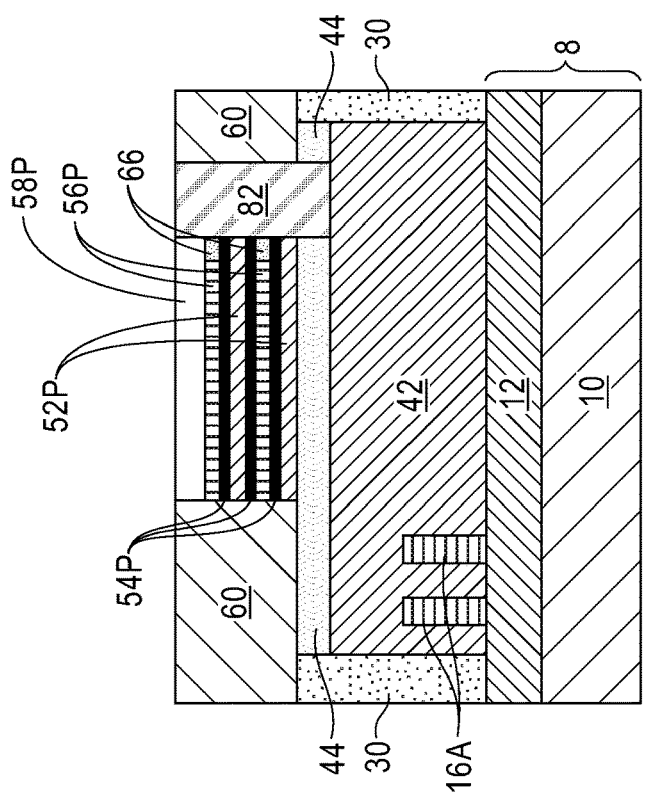
FIG. 17C is a cross-sectional view of the exemplary semiconductor structure of FIG. 17A along line C-C'.

Referring to FIGS. 9A-9D, there are illustrated various views of the exemplary semiconductor structure of FIGS. 8A-8D after patterning the insulator layer 58 and the MIM stack (52, 54, 56) to form a MIM capacitor overlying and contacting the source/drain interconnect structure 48 and the functional gate 42 of the first functional gate stack 40A and an insulator portion 58) on top of the MIM capacitor. The MIM capacitor includes alternating first metal electrodes 52P and the second metal electrodes 56P, and capacitor dielectrics 54P insulating the first metal electrodes 52P and the second metal electrodes 56P from each other. In one embodiment and as shown, the MIM capacitor (52P, 54P, 56P) is L-shaped having a first leg that extends along the first direction X1 and contacts the functional gate 42 of the first functional gate stack 40A and a second leg that extends along the second direction Y1 and contacts the source/drain interconnect structure 48. It should be noted that although an L-shape MIM capacitor is illustrated in FIG. 9A and described above, any capacitor shape that tends to maximize the effective area of the MIM capacitor can be employed.

The patterning of the insulator layer 58 and the MIM stack can be performed by first applying a photoresist layer (not shown) on top of the insulator layer 58 and lithographically patterning the photoresist layer such that a remaining portion of the photoresist layer, i.e., a patterned photoresist layer (not shown), only covers the source/drain interconnect structure 48 and a portion of the first functional gate stack 40A located over the buried insulator layer 12. Subsequently, portions of the insulator layer 58 and the MIM stack (52, 54, 56) that are not covered by the patterned photoresist layer are removed by at least one anisotropic etch, which can be a dry etch such as RIE or a wet etch. After etching, a remaining portion of the insulator layer constitutes the insulator portion, a remaining portion of each first metal layer 52 constitutes a first metal electrode 52P, a remaining portion of each capacitor dielectric layer 54 constitutes a capacitor dielectric 54P, and a remaining portion of each second metal layer 56 constitutes a second metal electrode 56P.

Referring to FIGS. 10A-10D, there are illustrated various views of the exemplary semiconductor structure of FIGS. 9A-9D after forming a contact level dielectric layer 60 on the ILD layer 30, the functional gate stacks 40A, 40B, 40C, the gate spacers 26 and the source/drain contact structures 46A, 46B, 46C. The contact level dielectric layer 60 may include a dielectric material the same as, or different from, the dielectric material that provides the ILD layer 30. For example, the contact level dielectric layer 60 can be a doped silicate glass, an undoped silicate glass (silicon oxide), an organosilicate glass (OSG), or a porous dielectric material. The contact level dielectric layer 60 may be formed by CVD, PVD or spin coating. After deposition, the contact level dielectric layer 60 may be subsequently planarized, for example, by CMP using the insulator portion 58P as a polishing stop. The contact level dielectric layer 60 laterally surrounds the MIM capacitor (52P, 54P, 56P) and the insulator portion 58P and has a top surface coplanar with the top surface of the insulator portion 58P.

Referring to FIGS. 11A-11D, there are illustrated various views of the exemplary semiconductor structure of FIGS. 10A-10D after forming a first opening 62 extending through the insulator portion 58P, the MIM capacitor (52P, 54P, 56P) and the gate cap 44 of the first functional gate stack 40A to expose a surface of the functional gate 42 of the first functional gate stack 40A. The first opening 62 also exposes sidewalls of the MIM capacitor (52P, 54P, 56P) located at a first end of the MIM capacitor (52P, 54P, 56P) (i.e., an end of the first leg of the MIM capacitor)).

The first opening 62 can be formed by first applying a mask layer (not shown) on the contact level dielectric layer 60 and the insulator portion 58P and lithographically patterning the mask layer to form a patterned mask layer having an opening therein. The mask layer can be a photoresist layer or a photoresist layer in conjunction with a hardmask layer(s). A portion of the insulator portion 58P that is exposed by the opening within the patterned mask layer and the underlying MIM capacitor (52P, 54P, 56P) and the gate cap 44 of the first functional gate stack 40A are then removed by at least one anisotropic etch. The etch can be a dry etch such as RIE or a wet etch. After etching, the patterned mask layer can be removed, for example, by oxygen-based plasma etching.

Referring to FIGS. 12A-12D, there are illustrated various views of the exemplary semiconductor structure of FIGS. 11A-11D after slightly recessing physically exposed sidewalls of the second metal electrodes 56P to form first undercut regions 64 between adjacent dielectrics including adjacent capacitor dielectrics 54P as well as adjacent insulator portion 58 and capacitor dielectric 54P. Sidewalls of the second metal electrodes 56P are thus offset from sidewalls of the capacitor dielectrics 54P. An isotropic etch can be performed to laterally etch the second metal electrodes 56P selective to the first metal electrodes 52P, the capacitor dielectrics 54P and the insulator portion 58P. The isotropic etch can be a dry etch such as RIE or a wet etch.

Referring to FIGS. 13A-13D, there are illustrated various views of the exemplary semiconductor structure of FIGS. 12A-12D after forming a first dielectric cap 66 to fill each first undercut region 64. Each first dielectric cap 66 has an outer sidewall vertically aligned with the sidewalls of the capacitor dielectrics 54P.

The first dielectric caps 66 may be formed by first forming a conformal dielectric layer (not shown) over physically exposed surfaces of the ILD layers 30, the contact level dielectric layer 60, the first functional gate stack 40A, the gate spacer 26, the insulator portion 58P and the MIM capacitor (52P, 54P, 56P). The conformal dielectric layer may include a dielectric material having a gap filling property, thereby filling the first undercut regions 64. In one embodiment, the conformal dielectric layer may include a dielectric oxide such as, for example, a high density plasma oxide. The conformal dielectric layer may be deposited by a conformal deposition process such as, for example, CVD or ALD. Subsequently, portions of the conformal dielectric layer located outside of the first undercut regions 64 are removed utilizing a selective etching process. In one embodiment, an isotropic etch such as, for example, a wet etch is performed. After etching, portions of the conformal dielectric layer remained in the first undercut regions 64 constitute the first dielectric caps 66.

Referring to FIGS. 14A-14D, there are illustrated various views of the exemplary semiconductor structure of FIGS. 13A-13D after forming a second opening 72 extending through the insulator portion 58P and the MIM capacitor (52P, 54P, 56P), and in some embodiments, the contact level dielectric layer 60, to expose a surface of the ILD layer 30. The second opening 72 also exposes sidewalls of the MIM capacitor (52P, 54P, 56P) at a first end of the MIM capacitor (52P, 54P, 56P) (e.g., an end of the second leg of the MIM capacitor). The second opening 72 can be formed by performing processing steps described in FIGS. 11A-11D for formation of the first opening 62.

Referring to FIGS. 15A-15D, there are illustrated various views of the exemplary semiconductor structure of FIGS. 14A-14D after slightly recessing the first metal electrodes 52P to provide second undercut regions (not shown) between adjacent capacitor dielectrics 54P and forming second dielectric caps 76 to fill the second undercut regions. The second undercut regions can be formed by lateral etching physically exposed sidewalls of the first metal electrode 52P using the processing steps described in FIGS. 12A-12D for formation of first undercut regions 64. Sidewalls of the first metal electrodes 52P are thus offset from the sidewalls of the capacitor dielectrics 54P. The second dielectric caps 76 can be formed by performing the processing steps described in FIGS. 13A-13D for formation of first dielectric caps 66.

Referring to FIGS. 16A-16D, there are illustrated various views of the exemplary semiconductor structure of FIGS. 15A-15D after forming a first capacitor contact structure 82 within the first opening 62 and a second capacitor contact structure 84 within the second opening 72. The first capacitor contact structure 82 laterally contacts the first metal electrodes 52P, thereby electrically connecting the MIM capacitor (52P, 54P, 56P) to the functional gate 42 of the first functional gate stack 40A. The second capacitor contact structure 84 laterally contacts the second metal electrodes 56P, thereby electrically connecting the MIM capacitor (52P, 54P, 56P) to the source/drain interconnect structure 48.

The capacitor contact structures 82, 84 may be formed by depositing a conductive metal within the first opening 62 and the second opening 72. Exemplary conductive metals that can used to provide the capacitor contact structures 82, 84 include, but are not limited to W, Cu, Al, Co, Ru, Mo, Os, Ir, Rh, and alloys thereof. Any conductive metal deposited on the top surface of contact level dielectric layer 60 may be removed by a planarization process such as, for example, CMP. In some embodiments, a contact liner (not shown) may be formed along surfaces of each opening 62, 72 to surround each of the first capacitor contact structure 82 and the second capacitor contact structure 84. In one embodiment, each contact liner may include TiN.

Referring to FIGS. 17A-17D, there are illustrated various views of the exemplary semiconductor structure of FIGS. 16A-16D after forming various contact structures to FET components. The contact structures include first contact structures 90 extending through the contact level dielectric layer 60 to form contact with the first source/drain contact structures 46A, a second contact structure 92 extending through the contact level dielectric layer 60 to form contact with the second source/drain contact structure 46B, a third contact structure 94 extending through the contact level dielectric layer 60 to form contact with the third source/drain contact structure 46C, a first gate contact structure 96 extending through the contact level dielectric layer 60 and the gate cap 44 of the second functional gate stack 40B to form contact with the functional gate 42 of the second functional gate stack 40B, and a second gate contact structure 98 extending through the contact level dielectric layer 70 and the gate cap 44 of the third functional gate stack 40C to form contact with the functional gate 42 of the third functional gate stack 40C.

When wired to form a crossbar configuration, one of the first contact structures 90 is coupled to one voltage line, the other of the first contact structures 90 is coupled to one current line, the second contact structure 92 and the second capacitor contact structure 84 are coupled to ground (GND), the third contact structure 96 is coupled to $V_{dd}$, the first gate contact structure 96 is coupled to a first input line, and the second gate contact structure 96 is coupled to a second input line.

The various contact structures 90-98 can be formed by performing processing steps described above in FIGS. 7A-7D for the formation of source/drain contact structures 46A, 46B, 46C and the source/drain interconnect structure 48.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claim.

What is claimed is:

1. A method of forming a memory cell comprising:
providing a first field effect transistor (FET) comprising a first functional gate stack that contacts a portion of a first semiconductor material portion and first source/drain regions located on opposite sides of the first functional gate stack in a first active region of a substrate, a second FET comprising a second functional gate stack that contacts a portion of a second semiconductor material portion and second source/drain regions located on opposite sides of the second functional gate stack in a second active region of the substrate, and a third FET comprising a third functional gate stack that contacts a portion of a third semiconductor material portion and third source/drain regions located on opposite sides of the third functional gate stack in a third active region of the substrate;
forming first source/drain contact structures overlying and contacting the first source/drain regions, a second source/drain contact structure overlying and contacting one of the second source/drain regions, a third source/drain contact structure overlying and contacting one of the third source/drain regions, and a source/drain interconnect structure connecting the other of the second source/drain regions and the other of the third source/drain regions, wherein the first, the second and the third source/drain contact structures and the source/drain interconnect structure are laterally surrounded by an interlevel dielectric (ILD) layer located over the substrate;
forming a metal-insulator-metal (MIM) capacitor overlying and contacting the source/drain interconnect structure and a functional gate of the first functional gate stack, wherein the MIM capacitor is laterally surrounded by a contact level dielectric layer located over the ILD layer.

2. The method of claim 1, wherein the MIM capacitor comprises alternating first metal electrodes and second metal electrodes, and capacitor dielectrics located between the first metal electrodes and the second metal electrodes and insulating the first metal electrodes and the second metal electrodes from each other.

3. The method of claim 2, wherein the forming the MIM capacitor comprises:
forming a MIM stack on the first, the second and the third FETs, the first, the second and the third source/drain contact structures, the source/drain interconnect structure and the ILD layer, the MIM stack comprising alternating first metal layers and second metal layers and capacitor dielectric layers separating the first metal layers and the second metal layers from each other;
forming an insulator layer on a topmost surface of the MIM stack; and
patterning the MIM stack to provide the MIM capacitor and an insulator portion located on a topmost surface of the MIM capacitor.

4. The method of claim 3, further comprising forming a contact level dielectric layer on the ILD layer, the contact level dielectric layer laterally surrounds the MIM capacitor and the insulator portion.

5. The method of claim 4, further comprising forming a first capacitor contact structure contacting the first metal electrodes at a first end of the MIM capacitor where the first functional gate stack is located and a second capacitor contact structure contacting the second metal electrodes at a second end of the MIM capacitor wherein the source/drain interconnect structure is located.

6. The method of claim 5, wherein the forming the first capacitor contact structure and the second capacitor contact structure comprising:
   forming a first opening to expose sidewalls of the alternating first metal electrodes and the second metal electrodes and the capacitor dielectrics at the first end of the MIM capacitor and a top surface of the functional gate of the first functional gate stack;
   laterally etching the exposed sidewalls of the second metal electrodes to provide first undercut regions;
   forming first dielectric caps within the first undercut regions;
   forming a second opening to expose sidewalls of the alternating first metal electrodes and the second metal electrodes and the capacitor dielectrics at the second end of the MIM capacitor;
   laterally etching the exposed sidewalls of the first metal electrodes to provide second undercut regions;
   forming second dielectric caps within the second undercut regions; and
   forming the first capacitor contact structure within the first opening and the second capacitor contact structure within the second opening.

7. The method of claim 3, further comprising forming first contact structures extending through the contact level dielectric layer to form contact with the first source/drain contact structures, a second contact structure extending through the contact level dielectric layer to form contact with the second source/drain contact structure, a third contact structure extending through the contact level dielectric layer to form contact with the third source/drain contact structure, a first gate contact structure extending through the contact level dielectric layer and a gate cap of the second functional gate stack to form contact with a functional gate of the second functional gate stack, and a second gate contact structure extending through the contact level dielectric layer and a gate cap of the third functional gate stack to form contact with a functional gate of the third functional gate stack.

8. The method of claim 1, wherein the forming the first, the second, and the third FET comprises:
   forming a first sacrificial gate stack on the portion of the first semiconductor material portion, a second sacrificial gate stack on the portion of the second semiconductor material portion, and a third sacrificial gate stack on the portion of the third semiconductor material portion;
   forming a gate spacer on sidewalls of each of the first, the second, and the third sacrificial gate stack;
   forming the first, the second, and the third source/drain regions; and
   replacing the first, the second, and the third sacrificial gate stack with the first, the second, and the third functional gate stack, respectively.

9. The method of claim 8, wherein the forming the first, the second, and the third source/drain regions comprises:
   epitaxially growing a first semiconductor material on portion of the first semiconductor material portion located on the opposite sides of the first sacrificial gate stack and on portions of the second semiconductor material portion located on the opposite sides of the second sacrificial gate stack while covering the third active region; and
   epitaxially growing a second semiconductor material on portions of the third semiconductor material portion located on the opposite sides of the third sacrificial gate stack while masking the first active region and second active region.

10. The method of claim 1, wherein the first, second, and third semiconductor material portions are semiconductor fins.

11. The method of claim 1, wherein the first, second, and third semiconductor material portions are semiconductor nanowires.

12. The method of claim 1, wherein the first, second, and third semiconductor material portions are planar portions of a semiconductor material.

13. The method of claim 1, wherein the providing of the first FET, the second FET and the third FET comprises a replacement gate process in which first, second and third sacrificial gate stacks are formed, and after forming the first, second and third source/drain regions, the first, second and third replacement gate stacks are replaced with the first, second and third functional gate stacks, respectively.

14. The method of claim 1, wherein the first, second, and third source/drain regions are formed by a selective epitaxial growth process.

15. The method of claim 1, wherein the first and third FETs are n-type FETs, and the second FET is a p-type FET.

16. The method of claim 1, wherein the first and third FETs are p-type FETs, and the second FET is an n-type FET.

17. The method of claim 2, wherein the first metal electrodes comprise two first metal layers, the second metal electrodes comprises two second metal layers, and the capacitor dielectrics comprises three capacitor dielectric layers.

18. The method of claim 1, wherein the MIM capacitor is L-shaped having a first leg overlying and contacting the functional gate of the first functional gate stack and a second leg overlying and contacting the source/drain interconnect structure.

19. A method of forming a memory cell comprising:
   providing a first field effect transistor (FET) comprising a first functional gate stack that contacts a portion of a first semiconductor material portion and first source/drain regions located on opposite sides of the first functional gate stack in a first active region of a substrate, a second FET comprising a second functional gate stack that contacts a portion of a second semiconductor material portion and second source/drain regions located on opposite sides of the second functional gate stack in a second active region of the substrate, and a third FET comprising a third functional gate stack that contacts a portion of a third semiconductor material portion and third source/drain regions located on opposite sides of the third functional gate stack in a third active region of the substrate;
   forming first source/drain contact structures overlying and contacting the first source/drain regions, a second source/drain contact structure overlying and contacting one of the second source/drain regions, a third source/drain contact structure overlying and contacting one of the third source/drain regions, and a source/drain interconnect structure connecting the other of the second source/drain regions and the other of the third source/drain regions; and
   forming a metal-insulator-metal (MIM) capacitor overlying and contacting the source/drain interconnect structure and a functional gate of the first functional gate stack.

20. The method of claim 19, wherein the MIM capacitor is L-shaped having a first leg overlying and contacting the functional gate of the first functional gate stack and a second leg overlying and contacting the source/drain interconnect structure.

* * * * *